United States Patent
Sakurai

(10) Patent No.: US 9,541,927 B2
(45) Date of Patent: Jan. 10, 2017

(54) ELECTRONIC SYSTEM, A METHOD AND NON-TRANSITORY COMPUTER-READABLE RECORDING MEDIUM FOR CONTROLLING AN ELECTRONIC SYSTEM

(71) Applicant: FUJITSU LIMITED, Kawasaki-shi, Kanagawa (JP)

(72) Inventor: Yasutomo Sakurai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 584 days.

(21) Appl. No.: 14/105,267

(22) Filed: Dec. 13, 2013

(65) Prior Publication Data

US 2014/0100709 A1 Apr. 10, 2014

Related U.S. Application Data

(63) Continuation of application No. PCT/JP2011/064590, filed on Jun. 24, 2011.

(51) Int. Cl.
*G05D 23/19* (2006.01)
*H05K 7/20* (2006.01)

(52) U.S. Cl.
CPC .......... *G05D 23/19* (2013.01); *H05K 7/20836* (2013.01)

(58) Field of Classification Search
CPC .............................. G05D 23/19; H05K 7/20836
See application file for complete search history.

(56) References Cited

U.S. PATENT DOCUMENTS

| | | | | |
|---|---|---|---|---|
| 5,484,012 A * | 1/1996 | Hiratsuka | ............ | G11B 33/142 165/247 |
| 5,519,394 A * | 5/1996 | Matsuo | ............... | H03M 7/3082 341/51 |
| 6,398,505 B1 * | 6/2002 | Sekiguchi | ............. | F04D 27/004 361/695 |
| 2002/0005916 A1 * | 1/2002 | Sawai | ................... | H04N 5/7441 348/748 |
| 2002/0079746 A1 * | 6/2002 | Hashimoto | ............. | G06F 1/206 307/149 |
| 2005/0242202 A1 * | 11/2005 | Jones | ................... | H05K 7/20209 236/49.3 |

(Continued)

FOREIGN PATENT DOCUMENTS

JP 61-125567 6/1986
JP 61-125567 A 6/1986

(Continued)

OTHER PUBLICATIONS

Extended European Search Report dated Aug. 26, 2015 for corresponding European Patent Application No. 11868071.9, 7 pages.

(Continued)

*Primary Examiner* — Ramesh Patel
(74) *Attorney, Agent, or Firm* — Fujitsu Patent Center

(57) ABSTRACT

A monitoring processor controls a plurality of electronic devices that each include a cooling fan that cools inside of a casing and a fan controller that controls the cooling fan. The monitoring processor includes a fan speed controller that performs control on the fan controllers of the respective electronic devices to change rotation speed of at least any cooling fan based on pieces of sound pressure information of sounds emitted by the respective electronic devices measured by a sound pressure measuring device.

9 Claims, 25 Drawing Sheets

(56) References Cited

U.S. PATENT DOCUMENTS

| | | | | |
|---|---|---|---|---|
| 2009/0265045 A1* | 10/2009 | Coxe, III | ........... | H05K 7/20836 700/300 |
| 2009/0296342 A1* | 12/2009 | Matteson | ................ | G06F 1/206 361/679.46 |
| 2010/0100254 A1* | 4/2010 | Artman | .............. | H05K 7/20836 700/299 |
| 2012/0215359 A1* | 8/2012 | Michael | ................... | G06F 1/206 700/275 |
| 2012/0218707 A1* | 8/2012 | Chan | ................. | H05K 7/20518 361/679.48 |
| 2012/0247750 A1* | 10/2012 | Kobayashi | ......... | H05K 7/20836 165/287 |
| 2013/0336805 A1* | 12/2013 | Shibata | ................. | F04D 27/004 417/44.1 |

FOREIGN PATENT DOCUMENTS

| | | |
|---|---|---|
| JP | 03-207977 | 9/1991 |
| JP | 5-100063 A | 4/1993 |
| JP | 06-117743 | 4/1994 |
| JP | 2000-242340 | 9/2000 |
| JP | 2002-023267 | 1/2002 |
| JP | 2002-190686 | 7/2002 |
| JP | 2007-115070 | 5/2007 |
| JP | 2010-027911 | 2/2010 |

OTHER PUBLICATIONS

Japanese Office Action mailed Jul. 29, 2014 for corresponding Japanese Application No. 2013-521404, with Partial English Translation, 4 pages.

International Search Report, mailed in connection with PCT/2011/064590 and mailed Aug. 2, 2011.

* cited by examiner

FIG.2

Pattern 1 (11a)

| INFORMATION PROCESSOR | FAN ROTATION SPEED (ROTATION/SECOND) |
|---|---|
| INFORMATION PROCESSOR 30 | L |
| INFORMATION PROCESSOR 30a | M |
| INFORMATION PROCESSOR 30b | N |

FIG.3

Pattern 2-1 (11b)

| INFORMATION PROCESSOR | FAN ROTATION SPEED (ROTATION/SECOND) |
|---|---|
| INFORMATION PROCESSOR 30 | L×95% |
| INFORMATION PROCESSOR 30a | M×95% |
| INFORMATION PROCESSOR 30b | N×95% |

Pattern 2-2 (11c)

| INFORMATION PROCESSOR | FAN ROTATION SPEED (ROTATION/SECOND) |
|---|---|
| INFORMATION PROCESSOR 30 | L×90% |
| INFORMATION PROCESSOR 30a | M×90% |
| INFORMATION PROCESSOR 30b | N×90% |

FIG.4

| PATTERN 3-1 | |
|---|---|
| INFORMATION PROCESSOR | FAN ROTATION SPEED (ROTATION/SECOND) |
| INFORMATION PROCESSOR30 | L×105% |
| INFORMATION PROCESSOR30a | M×105% |
| INFORMATION PROCESSOR30b | N×105% |

11d

| PATTERN 3-2 | |
|---|---|
| INFORMATION PROCESSOR | FAN ROTATION SPEED (ROTATION/SECOND) |
| INFORMATION PROCESSOR30 | L×110% |
| INFORMATION PROCESSOR30a | M×110% |
| INFORMATION PROCESSOR30b | N×110% |

| GROUP OF PRIORITY 1 | INFORMATION PROCESSORS #9 TO #16 |
|---|---|
| GROUP OF PRIORITY 2 | INFORMATION PROCESSORS #5 TO #8 |
| GROUP OF NO PRIORITY | INFORMATION PROCESSORS #1 TO #4 |

FIG.15D

| PRIORITY | TEMPERATURE | FAN ROTATION SPEED (ROTATION/MINUTE) |
|---|---|---|
| GROUP OF PRIORITY 1 | 30 DEGREES OR MORE | 5000 |
| | 25 DEGREES OR MORE AND LESS THAN 30 DEGREES | 4000 |
| | LESS THAN 25 DEGREES | 3000 |
| GROUP OF PRIORITY 2 | 30 DEGREES OR MORE | 4000 |
| | 25 DEGREES OR MORE AND LESS THAN 30 DEGREES | NO CHANGE |
| | LESS THAN 25 DEGREES | NO CHANGE |
| GROUP OF NO PRIORITY | 30 DEGREES OR MORE | NO CHANGE |
| | 25 DEGREES OR MORE AND LESS THAN 30 DEGREES | NO CHANGE |
| | LESS THAN 25 DEGREES | NO CHANGE |

FIG.24

| SOUND ANALYSIS RESULT / TEMPERATURE ANALYSIS RESULT | PEAK OF SOUND PRESSURE LEVEL IS XdB OR MORE | PEAK DIFFERENCE OF SOUND PRESSURE LEVEL IS YdB OR MORE | THE LEFT IS NOT APPLICABLE |
|---|---|---|---|
| 30 DEGREES OR MORE | +5% | +5% | +10% |
| 25 DEGREES OR MORE AND LESS THAN 30 DEGREES | NO CHANGE | NO CHANGE | +5% |
| LESS THAN 25 DEGREES | NO CHANGE | NO CHANGE | NO CHANGE |

FIG.25

| SOUND ANALYSIS RESULT / TEMPERATURE ANALYSIS RESULT | PEAK OF SOUND PRESSURE LEVEL IS XdB OR MORE | PEAK DIFFERENCE OF SOUND PRESSURE LEVEL IS YdB OR MORE | THE LEFT IS NOT APPLICABLE |
|---|---|---|---|
| 30 DEGREES OR MORE | -5% | -5% | NO CHANGE |
| 25 DEGREES OR MORE AND LESS THAN 30 DEGREES | -5% | -5% | NO CHANGE |
| LESS THAN 25 DEGREES | -10% | -5% | NO CHANGE |

| TABLE FOR 08:00 TO 18:00 ||
|---|---|
| TEMPERATURE | FAN ROTATION SPEED (ROTATION/MINUTE) |
| 30 DEGREES OR MORE | 4000 |
| 25 DEGREES OR MORE AND LESS THAN 30 DEGREES | 3000 |
| LESS THAN 25 DEGREES | 2000 |

11g

| TABLE FOR 18:00 TO 08:00 ||
|---|---|
| TEMPERATURE | FAN ROTATION SPEED (ROTATION/MINUTE) |
| 30 DEGREES OR MORE | 5000 |
| 25 DEGREES OR MORE AND LESS THAN 30 DEGREES | 4000 |
| LESS THAN 25 DEGREES | 3000 |

ELECTRONIC SYSTEM, A METHOD AND NON-TRANSITORY COMPUTER-READABLE RECORDING MEDIUM FOR CONTROLLING AN ELECTRONIC SYSTEM

CROSS-REFERENCE TO RELATED APPLICATION

This application is a continuation application of International Application PCT/JP2011/064590, filed on Jun. 24, 2011, and designating the U.S., the entire contents of which are incorporated herein by reference.

FIELD

The present invention relates to an electronic system, an electronic system control method, and a control program of the monitoring processor.

BACKGROUND

Conventionally known is, in order to prevent electronic components from degrading caused by heat emitted by the electronic components, an information processor including a plurality of cooling fans for cooling the electronic components.

The cooling fan of such an information processor emits a sound rich in a specific frequency component in accordance with its rotation speed. Given this situation, when setting the rotation speeds of the respective cooling fans of the information processor to be the same rotation speed, the information processor increases the sound level of the specific frequency component and produces noise.

Known is an information processor that sets the rotation speeds of the cooling fans to be different rotation speeds in order to reduce such kind of noise or the like. Such an information processor sets the rotation speeds of the respective cooling fans of the information processor to be different rotation speeds, thereby displacing the peaks of the frequency components of the sounds emitted by the respective cooling fans and reducing noise.

Patent Document 1: Japanese Laid-open Patent Publication No. 2000-242340
Patent Document 2: Japanese Laid-open Patent Publication No. 06-117743
Patent Document 3: Japanese Laid-open Patent Publication No. 2002-023267

However, the technology that sets the rotation speeds of the cooling fans of the information processor to be different rotation speeds cannot reduce noise appropriately when a plurality of information processors are operated at the same time.

For example, it is hard to predict in advance noise emitted by the entire information processing system that includes a plurality of information processors in which information processors of different makers coexist. Because of this, unless the information processing system is actually operated, the noise emitted by the information processing system cannot be confirmed. As a result of this, the above technology cannot perform feedback control based on the noise emitted by the information processing system on the setting of the rotation speeds of the cooling fans of the respective information processors. The above technology cannot predict in advance noises emitted by the respective information processors and noise emitted by part of the information processors through a specific frequency component that is emphasized, unless the information processing system is actually operated.

Although in a computer room in which an information processing system is installed such as a data center noise is less problematic, a specific frequency component may propagate to the surroundings of the computer room and produce noise depending on the structure of a building in which the information processor is installed. It is hard to predict noise emitted by such an information processing system before the information processing system is installed.

SUMMARY

In one aspect, the present invention is a monitoring processor that controls a plurality of electronic devices that each include a cooling fan that cools inside of a casing and a fan controller that controls the cooling fan. The monitoring processor performs control on the fan controllers of the respective electronic devices to change rotation speed of at least any cooling fan based on pieces of sound pressure information of sounds emitted by the respective electronic devices measured by a sound pressure measuring device.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 is a first view for illustrating an example of a rotation speed table according to the first embodiment;

FIG. 3 is a second view for illustrating an example of rotation speed tables according to the first embodiment;

FIG. 4 is a third view for illustrating an example of rotation speed tables according to the first embodiment;

FIG. 15c is a view for illustrating an example of group information according to the third embodiment;

FIG. 15d is a view for illustrating rotation speeds that a monitoring server according to the third embodiment sets in cooling fans of the information processors of the respective groups;

FIG. 24 is a view for illustrating an example of control to a cooling fan of an information processor that prioritizes temperature;

FIG. 25 is a view for illustrating an example of control to a cooling fan of an information processor that prioritizes sound;

FIG. 27 is a view for illustrating rotation speed tables for setting different rotation speeds by temperature.

DESCRIPTION OF EMBODIMENTS

Described below with reference to the attached drawings are a monitoring processor, an electronic system, an electronic system control method, and a control program of a monitoring processor according to the present application.

First Embodiment

Figure 1:
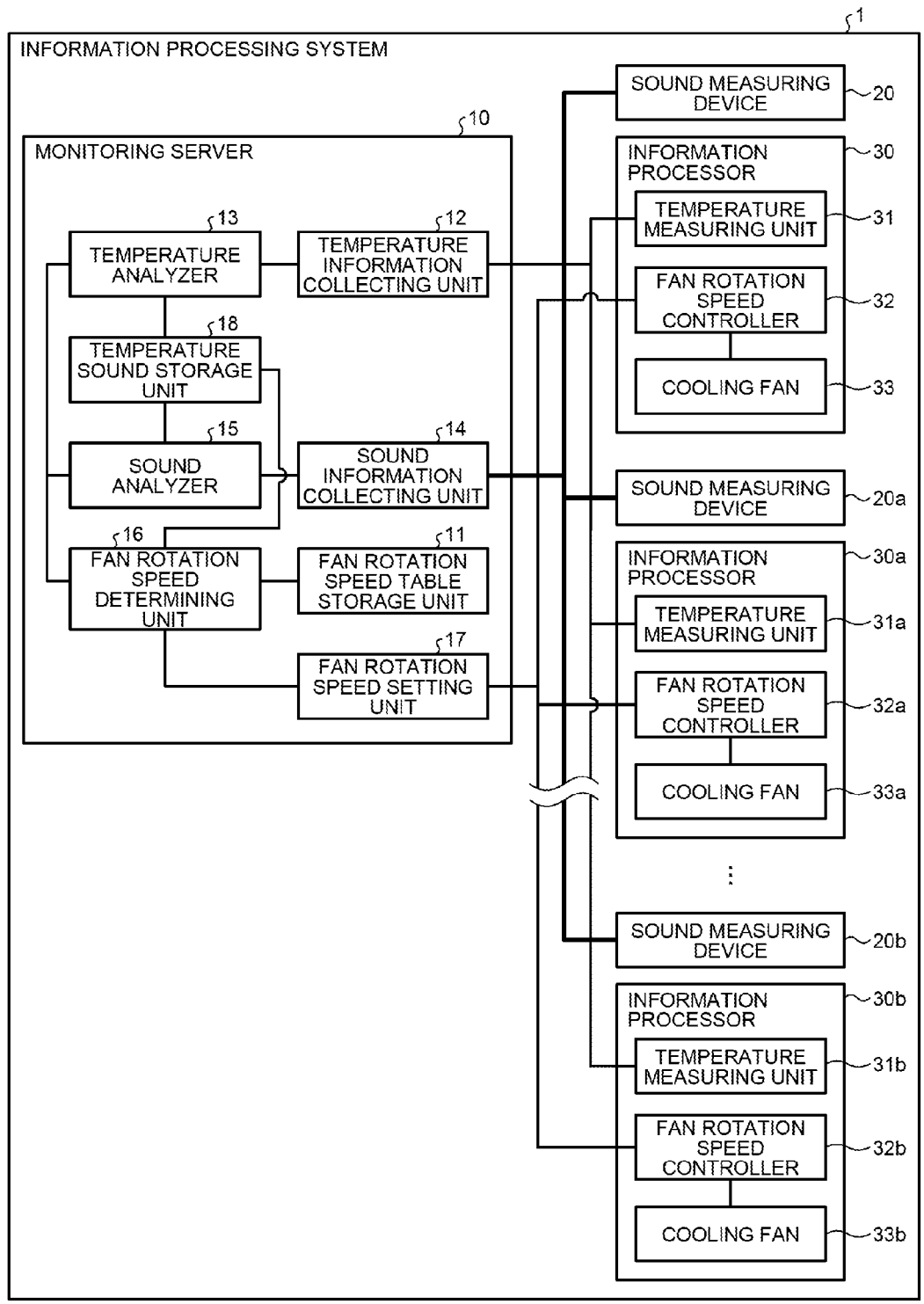
FIG. 1 is a diagram for illustrating an example of an information processing system according to a first embodiment.

A first embodiment below describes an example of an information processing system with reference to FIG. 1. FIG. 1 is a diagram for illustrating an example of an information processing system according to the first embodiment. In the example illustrated in FIG. 1, this information processing system 1 includes a monitoring server 10, a plurality of sound measuring devices 20, 20a, and 20b, and a plurality of information processors 30, 30a, and 30b.

The monitoring server 10 includes a fan rotation speed table storage unit 11, a temperature information collecting unit 12, a temperature analyzer 13, a sound information collecting unit 14, a sound analyzer 15, a fan rotation speed determining unit 16, a fan rotation speed setting unit 17, and a temperature sound storage unit 18. The information processor 30 includes a temperature measuring unit 31, a fan rotation speed controller 32, and a cooling fan 33. The information processor 30a includes a temperature measuring unit 31a, a fan rotation speed controller 32a, and a cooling fan 33a. The information processor 30b includes a temperature measuring unit 31b, a fan rotation speed controller 32b, and a cooling fan 33b.

Although omitted in FIG. 1, the information processing system 1 may include a plurality of sound measuring devices other than the sound measuring devices 20, 20a, and 20b. The information processing system 1 may include a plurality of information processors other than the information processors 30, 30a, and 30b.

Described first are the units of the sound measuring devices 20, 20a, and 20b and the information processors 30, 30a, and 30b of the information processing system 1. The following description omits the description of the units 31a to 33a of the information processor 30a and the units 31b to 33b of the information processor 30b, because they exhibit the same functions as the respective units 31 to 33 of the information processor 30.

The sound measuring devices 20 to 20b are sound measuring devices placed in the vicinity of the information processors 30 to 30b, respectively. Specifically, the sound measuring devices 20 to 20b measure sounds emitted by the information processors 30 to 30b, respectively, and generate waveform data indicating the measured sounds. Upon receiving a sound information transmission request from the sound information collecting unit 14 of the monitoring server 10, the sound measuring devices 20 to 20b transmit the generated waveform data as sound information to the sound information collecting unit 14.

The temperature measuring unit 31 measures the temperature within the information processor 30 and transmits to the temperature information collecting unit 12 information indicating the measured temperature. For example, the temperature measuring unit 31 measures the temperature within the information processor 30 using a temperature measuring device that uses a thermocouple or the like and generates the information indicating the measured temperature. Upon receiving a temperature information transmission request from the temperature information collecting unit 12 of the monitoring server 10, the temperature measuring unit 31 transmits to the temperature information collecting unit 12 the generated information indicating the temperature.

The fan rotation speed controller 32 is a controller that controls the rotation speed of the cooling fan 33. Specifically, upon receiving information indicating the rotation speed of the cooling fan 33 from the fan rotation speed setting unit 17 of the monitoring server 10, the fan rotation speed controller 32 sets the rotation speed of the cooling fan 33 to be a rotation speed indicated by the received information.

The cooling fan 33 is a cooling fan that cools various kinds of electronic devices of the information processor 30. Specifically, the cooling fan 33 is a cooling fan capable of setting any rotation speed within a range of rated rotating speeds and rotates a fan at a rotation speed set by the fan rotation speed controller 32 to cool the various kinds of electronic devices included in a casing of the information processor 30.

Described next are the units 10 to 17 of the monitoring server 10. The fan rotation speed table storage unit 11 is a storage unit that stores therein a plurality of rotation speed tables listing the rotation speeds of the respective cooling fans of the information processors 30 to 30*b*. Specifically, the fan rotation speed table storage unit 11 stores therein a rotation speed table listing the rotation speeds of the respective cooling fans 33 to 33*b* at an initial state as a rotation speed table of "Pattern 1."

The fan rotation speed table storage unit 11 stores therein a group of a plurality of rotation speed tables listing lower rotation speeds than those of the rotation speed table of "Pattern 1" as a group of rotation speed tables of "Pattern 2." The fan rotation speed table storage unit 11 stores therein a group of a plurality of rotation speed tables listing higher rotation speeds than those of the rotation speed table of "Pattern 1" as a group of rotation speed tables of "Pattern 3." In other words, the following refers to a set of a plurality of rotation speed tables as a group of rotation speed tables.

Described below with reference to FIG. 2 to FIG. 4 are the rotation speed tables stored by the fan rotation speed table storage unit 11. Described first with reference to FIG. 2 is the rotation speed table of Pattern 1. FIG. 2 is a first view for illustrating an example of a rotation speed table according to the first embodiment. The rotation speed table illustrated in FIG. 2 is a rotation speed table 11*a* stored as "Pattern 1" in the fan rotation speed table storage unit 11. The rotation speed table of "Pattern 1" 11*a* stores therein information indicating the information processors 30 to 30*b* and the rotation speeds of the respective cooling fans 33 to 33*b* of the information processors 30 to 30*b* in association with each other.

The example illustrated in FIG. 2 indicates that the rotation speed table of "Pattern 1" 11*a* sets the rotation speed of the cooling fan 33 of the information processor 30 to be "L" (rotation/second) and sets the rotation speed of the cooling fan 33*a* of the information processor 30*a* to be "M" (rotation/second). The rotation speed table of "Pattern 1" 11*a* sets the rotation speed of the cooling fan 33*b* of the information processor 30*b* to be "N" (rotation/second). In other words, the rotation speed table of "Pattern 1" 11*a* indicates that the rotation speeds of the respective cooling fans 33 to 33*b* of the information processors 30 to 30*b* are set to be different rotation speeds.

As described later, upon the starting up of the information processing system 1, the monitoring server 10 sets the rotation speeds of the respective cooling fans 33 to 33*b* of the respective information processors 30 to 30*b* to be the rotation speeds listed in the rotation table of "Pattern 1" 11*a*. In other words, the rotation speed table of "Pattern 1" 11*a* is a rotation speed table listing the initial values of the rotation speeds of the respective cooling fans 33 to 33*b*.

FIG. 3 is a second view for illustrating an example of rotation speed tables according to the first embodiment. The tables illustrated in FIG. 3 are a plurality of tables stored as a group of rotation speed tables of "Pattern 2." In the example illustrated in FIG. 3, a plurality of rotation speed tables 11*b*, 11*c*, . . . stored as the group of rotation speed tables of "Pattern 2" store therein the information processors 30 to 30*b* and the rotation speeds of the respective cooling fans 33 to 33*b* in association with each other in the same manner as the rotation speed table of "Pattern 1" 11*a*.

The fan rotation speed table storage unit 11 stores therein a plurality of tables as rotation speed tables included in the group of "Pattern 2" in addition to a rotation speed table of "Pattern 2-1" 11*b* and a rotation speed table of "Pattern 2-2" 11*c* illustrated in FIG. 3.

For example, the rotation speed table of "Pattern 2-1" 11*b* illustrated in FIG. 3 is a table that decreases the rotation speeds of the respective cooling fans 33 to 33*b* stored in the rotation speed table of "Pattern 1" 11*a* to 95 percent of their values before changing. The rotation speed table of "Pattern 2-2" 11*c* illustrated in FIG. 3 is a table that decreases the rotation speeds of the respective cooling fans 33 to 33*b* stored in the rotation speed table of "Pattern 1" 11*a* to 90 percent of their values before changing.

FIG. 4 is a third view for illustrating an example of rotation speed tables according to the first embodiment. The tables illustrated in FIG. 4 are a plurality of tables stored as a group of rotation speed tables of "Pattern 3." The tables stored as the group of rotation speed tables of "Pattern 3" store therein the information processors 30 to 30*b* and the rotation speeds of the respective cooling fans 33 to 33*b* in association with each other in the same manner as the rotation speed table of "Pattern 1" 11*a*.

The fan rotation speed table storage unit 11 stores therein a plurality of tables as rotation speed tables of the group of "Pattern 3" in addition to a rotation speed table of "Pattern 3-1" 11*d* and a rotation speed table of "Pattern 3-2" 11*e* illustrated in FIG. 4.

For example, the rotation speed table of "Pattern 3-1" 11*d* illustrated in FIG. 4 is a table that increases the rotation speeds of the respective cooling fans 33 to 33*b* stored in the rotation speed table of "Pattern 1" 11*a* to 105 percent of their values before changing. The rotation speed table of "Pattern 3-2" 11*e* illustrated in FIG. 4 is a table that increases the rotation speeds of the respective cooling fans 33 to 33*b* stored in the rotation speed table of "Pattern 1" 11*a* to 110 percent of their values before changing.

Returning back to FIG. 1, the temperature information collecting unit 12 transmits a temperature information transmission request to the temperature measuring units 31 to 31*b* at regular intervals. Upon receiving pieces of temperature information from the respective temperature measuring units 31 to 31*b*, the temperature information collecting unit 12 transmits the received pieces of temperature information to the temperature analyzer 13.

The temperature analyzer 13 analyzes the pieces of temperature information received by the temperature information collecting unit 12 from the respective information processors 30 to 30*b* and acquires the temperatures of the respective information processors 30 to 30*b*. The temperature analyzer 13 transmits the acquired information indicating the temperatures of the respective information processors 30 to 30*b* to the fan rotation speed determining unit 16. The temperature analyzer 13 stores the acquired information indicating the temperatures of the respective information processors 30 to 30*b* in the temperature sound storage unit 18.

The sound information collecting unit 14 transmits a sound information transmission request to the sound measuring devices 20 to 20*b* at regular intervals. Upon receiving pieces of sound information from the respective sound measuring devices 20 to 20*b*, the sound information collecting unit 14 transmits the received pieces of sound information to the sound analyzer 15.

Upon receiving the pieces of sound information from the sound information collecting unit 14, the sound analyzer 15 analyzes the received pieces of sound information and calculates the sound pressure levels of the respective frequency components for the sounds measured by the respective sound measuring devices 20 to 20b. The sound analyzer 15 transmits to the fan rotation speed determining unit 16 pieces of sound information indicating the sound pressure levels of the respective frequency components. The sound analyzer 15 stores the pieces of sound information indicating the sound pressure levels of the respective frequency components in the temperature sound storage unit 18.

The fan rotation speed determining unit 16 determines the rotation speeds of the respective cooling fans 33 to 33b of the respective information processors 30 to 30b based on the sounds measured by the respective sound measuring devices 20 to 20b and the temperatures measured by the respective temperature measuring units 31 to 31b. Specifically, upon the starting up of the information processing system 1, the fan rotation speed determining unit 16 refers to the rotation table of "Pattern 1" 11a among the tables stored in the fan rotation speed table storage unit 11.

The fan rotation speed determining unit 16 informs the fan rotation speed setting unit 17 of a rotation speed of "L" of the cooling fan 33, a rotation speed of "M" of the cooling fan 33a, and a rotation speed of "N" of the cooling fan 33b listed in the rotation speed table of "Pattern 1" 11a referred to. The fan rotation speed determining unit 16 stores therein "Pattern 1" as the current settings of the cooling fan 33, the cooling fan 33a, and the cooling fan 33b and stores information indicating that "Pattern 1" has been set in the temperature sound storage unit 18.

The fan rotation speed determining unit 16 receives from the temperature analyzer 13 the information indicating the temperatures of the respective information processors 30 to 30b. Based on the information indicating the temperatures of the respective information processors 30 to 30b, the fan rotation speed determining unit 16 determines whether there is any information processor whose temperature is higher than a predetermined threshold among the information processors 30 to 30b. If determining that there is any information processor whose temperature is higher than the predetermined threshold, the fan rotation speed determining unit 16 determines that there is a problem with temperature.

The fan rotation speed determining unit 16 receives from the sound analyzer 15 the information indicating the sound pressure levels of the respective frequency components for the sounds measured by the respective sound measuring devices 20 to 20b. Based on the received information indicating the sound pressure levels of the respective frequency components, the fan rotation speed determining unit 16 determines whether the average sound pressure level of the respective frequency components is higher than a predetermined threshold or whether a peak value, which is the maximum sound pressure level of the respective frequency components, is higher than a predetermined threshold. If determining that the sound pressure level of any frequency component is higher than the predetermined threshold or that the peak value of the respective frequency components is higher than the predetermined threshold, the fan rotation speed determining unit 16 determines that there is a problem with sound.

If determining that there is a problem with sound, the fan rotation speed determining unit 16 increases the rotation speeds of the respective cooling fans 33 to 33b. Specifically, if determining that there is a problem with temperature when the current setting is "Pattern 1," the fan rotation speed determining unit 16 refers to the rotation speed table of "Pattern 3-1" 11d, which is the lowest in the set rotation speeds among the rotation speed tables stored in the fan rotation speed table storage unit 11 as the rotation speed group of "Pattern 3."

The fan rotation speed determining unit 16 informs the fan rotation speed setting unit 17 of the rotation speeds of the respective cooling fans 33 to 33b listed in the rotation speed table of "Pattern 3-1" 11d. In other words, the fan rotation speed determining unit 16 increases the rotation speeds of the respective cooling fans 33 to 33b by 5 percent from the initial rotation speeds. The fan rotation speed determining unit 16 stores therein "Pattern 3-1" referred to as the current setting and stores information indicating that "Pattern 3-1" has been set in the temperature sound storage unit 18.

If determining that there is a problem with temperature again when the current setting is "Pattern 3-1," the fan rotation speed determining unit 16 refers to the rotation speed table of "Pattern 3-2" 11e stored in the fan rotation speed table storage unit 11. The fan rotation speed determining unit 16 informs the fan rotation speed setting unit 17 of the rotation speeds of the respective cooling fans 33 to 33b listed in the rotation speed table of "Pattern 3-2" 11e.

In other words, the fan rotation speed determining unit 16 increases the rotation speeds of the respective cooling fans 33 to 33b by 10 percent from the initial rotation speeds. Thus, upon determining that there is a problem with temperature again even though the rotation speeds of the respective cooling fans 33 to 33b are increased from the initial rotation speeds, the fan rotation speed determining unit 16 increases the rotation speeds of the respective cooling fans 33 to 33b further by a certain ratio.

If determining that there is no problem with temperature and if determining that there is a problem with sound, the fan rotation speed determining unit 16 decreases the rotation speeds of the respective cooling fans 33 to 33b. Specifically, if determining that there is no problem with temperature when the current setting is "Pattern 1," the fan rotation speed determining unit 16 refers to the rotation speed table of "Pattern 2-1" 11b, which is the highest in the rotation speeds among the rotation speed tables stored in the fan rotation speed table storage unit 11.

The fan rotation speed determining unit 16 informs the fan rotation speed setting unit 17 of the rotation speeds of the respective cooling fans 33 to 33b listed in the rotation speed table of "Pattern 2-1" 11b. In other words, the fan rotation speed determining unit 16 decreases the rotation speeds of the respective cooling fans 33 to 33b by 5 percent from the initial rotation speeds. The fan rotation speed determining unit 16 stores therein "Pattern 2-1" referred to as the current setting and stores information indicating that "Pattern 2-1" has been set in the temperature sound storage unit 18.

If determining that there is no problem with temperature and if determining that there is a problem with sound when the current setting is "Pattern 2-1," the fan rotation speed determining unit 16 refers to the rotation speed table of "Pattern 2-2" 11c. The fan rotation speed determining unit 16 informs the fan rotation speed setting unit 17 of the rotation speeds of the respective cooling fans 33 to 33b listed in the rotation speed table of "Pattern 2-2" 11c referred to. In other words, the fan rotation speed determining unit 16 decreases the rotation speeds of the respective cooling fans 33 to 33b by 10 percent from the initial rotation speeds. The fan rotation speed determining unit 16 stores therein "Pattern 2-2" referred to as the current setting and stores information indicating that "Pattern 2-2" has been set in the temperature sound storage unit 18.

If determining that there is no problem with temperature and if determining that there is no problem with sound when the current setting is "Pattern 3," the fan rotation speed determining unit 16 performs the following processing. Namely, the fan rotation speed determining unit 16 maintains the rotation speeds of the respective cooling fans 33 to 33b until receiving new pieces of temperature information and sound information.

If determining that there is no problem with temperature and if determining that there is a problem with sound when the current setting is "Pattern 3," the fan rotation speed determining unit 16 refers to a pattern whose rotation speeds of the respective cooling fans 33 to 33b are lower by one step than the current setting. For example, if determining that there is no problem with temperature and if determining that there is a problem with sound when the current setting is "Pattern 3-2," the fan rotation speed determining unit 16 refers to the rotation speed table of "Pattern 3-1" 11d. The fan rotation speed determining unit 16 informs the fan rotation speed setting unit 17 of the rotation speeds listed in the rotation speed table of "Pattern 3-1" 11d newly referred to and updates the current setting to "Pattern 3-1." The fan rotation speed determining unit 16 stores information indicating that "Pattern 3-1" has been selected in the temperature sound storage unit 18.

If determining that there is a problem with temperature when the current setting is the group of "Pattern 2," the fan rotation speed determining unit 16 refers to a pattern whose rotation speeds of the respective cooling fans 33 to 33b are higher by one step. For example, if determining that there is a problem with temperature when the current setting is the rotation speed table of "Pattern 2-2" 11c, the fan rotation speed determining unit 16 refers to the rotation speed table of "Pattern 2-1" 11b. The fan rotation speed determining unit 16 informs the fan rotation speed setting unit 17 of the rotation speeds listed in the rotation speed table of "Pattern 2-1" 11b newly referred to and updates the current setting to "Pattern 2-1." The fan rotation speed determining unit 16 stores information indicating that "Pattern 2-1" has been set in the temperature sound storage unit 18.

The fan rotation speed setting unit 17 sets the rotation speeds of the respective cooling fans 33 to 33b of the respective information processors 30 to 30b to be the rotation speeds informed of from the fan rotation speed determining unit 16. Specifically, the fan rotation speed setting unit 17 acquires information on the rotation speeds of the respective cooling fans 33 to 33b from the fan rotation speed determining unit 16. The fan rotation speed setting unit 17 transmits the acquired rotation speeds of the respective cooling fans 33 to 33b to the respective fan rotation speed controllers 32 to 32b.

Figure 5:
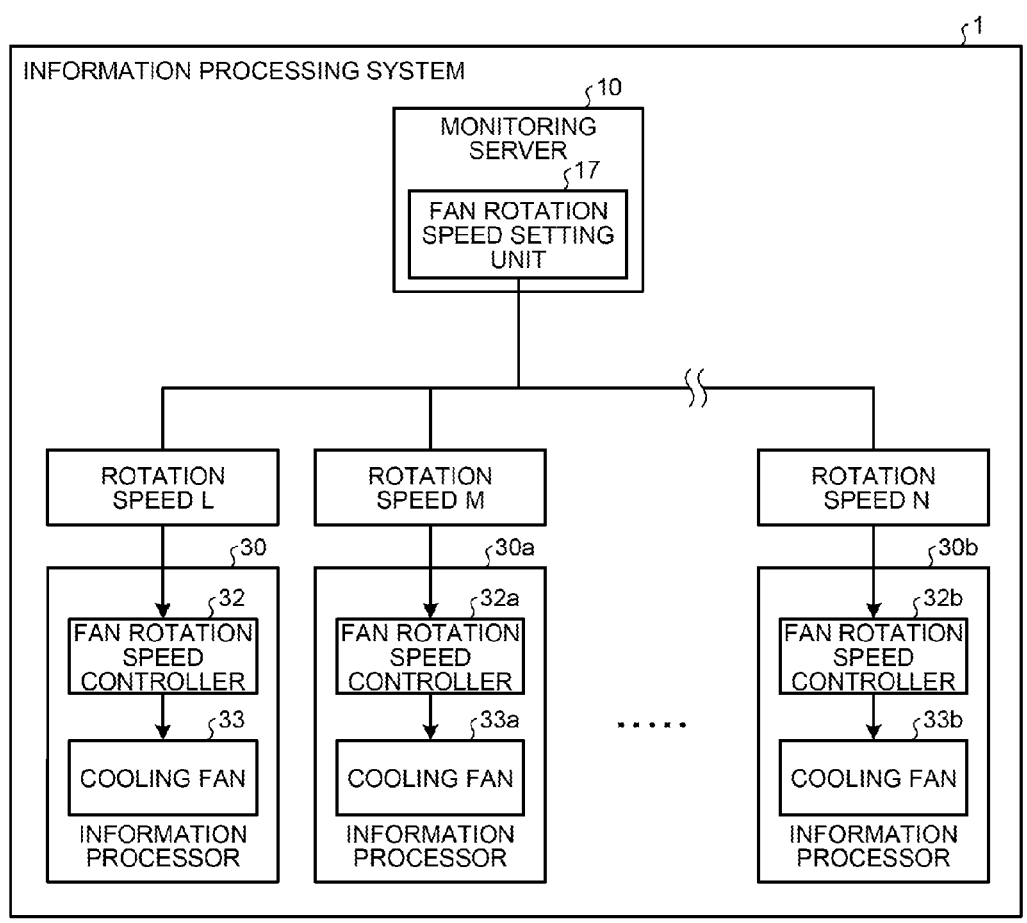
FIG. 5 is a diagram for illustrating rotation speeds set in the respective cooling fans upon starting up the information processing system according to the first embodiment.

Described here with reference to FIG. 5 are rotation speeds set in the respective cooling fans 33 to 33b. FIG. 5 is a diagram for illustrating the rotation speeds set in the respective cooling fans upon starting up the information processing system according to the first embodiment. In the example illustrated in FIG. 5, the fan rotation speed setting unit 17 of the monitoring server 10 informs the fan rotation speed controller 32 of the rotation speed "L" (rotation/second), informs the fan rotation speed controller 32a of the rotation speed "M" (rotation/second), and informs the fan rotation speed controller 32b of the rotation speed "N" (rotation/second). As a result of this, the fan rotation speed controllers 32 to 32b set different rotation speeds in the respective cooling fans 33 to 33b. This enables the information processing system 1 to reduce noise emitted by the entire information processing system 1.

Namely, a cooling fan emits a sound having frequency characteristics in accordance with a rotation speed. Given this situation, a conventional information processing system, when a plurality of cooling fans are operated at the same rotation speed, increases a sound pressure level at a specific frequency and emits noise. In contrast, the information processing system 1 sets different rotation speeds in the respective cooling fans 33 to 33b. As a result of this, because the frequency characteristics of the sounds emitted by the respective cooling fans 33 to 33b are different from each other, the information processing system 1 can prevent an increase in sound pressure level at a specific frequency and prevent noise.

Figure 6:
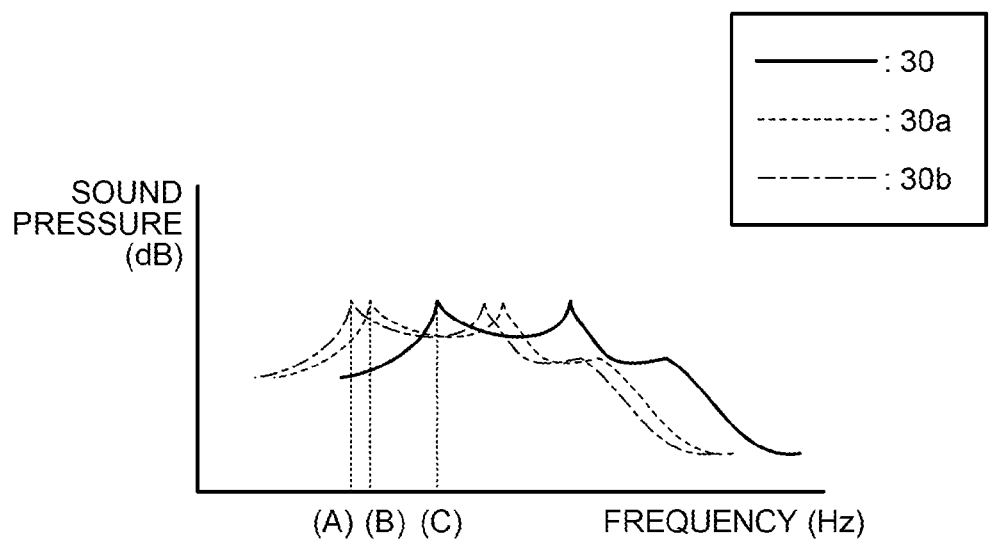
FIG. 6 is a graph for illustrating the frequency characteristics of sounds emitted by the respective information processors according to the first embodiment.

FIG. 6 is a graph for illustrating the frequency characteristics of sounds emitted by the respective information processors according to the first embodiment. For example, the example illustrated in FIG. 6 represents the frequency characteristics of a sound emitted by the information processor 30, the frequency characteristics of a sound emitted by the information processor 30a, and the frequency characteristics of a sound emitted by the information processor 30b.

(A) in FIG. 6 indicates a peak at which the sound pressure level is the highest in the sound consisting of frequencies emitted by the information processor 30b, and (B) in FIG. 6 indicates a peak at which the sound pressure level is the highest in the sound consisting of frequencies emitted by the information processor 30a. (C) in FIG. 6 indicates a peak at which the sound pressure level is the highest in the sound consisting of frequencies emitted by the information processor 30. As illustrated in FIG. 6, the information processing system 1 makes the rotation speeds of the respective cooling fans 33 to 33b of the respective information processors 30 to 30b different from each other, thereby enabling the peaks of the sounds emitted by the respective information processors 30 to 30b to be displaced to different frequencies.

Figure 7:
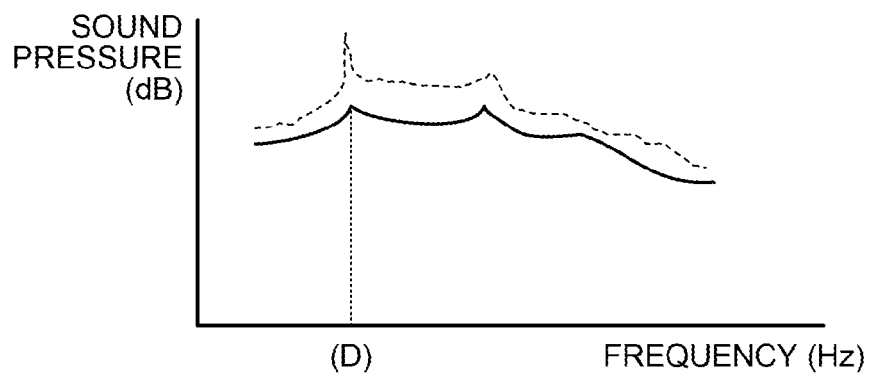
FIG. 7 is a graph for illustrating the frequency characteristics of sounds emitted by the information processing system according to the first embodiment.

FIG. 7 is a graph for illustrating the frequency characteristics of sounds emitted by the information processing system according to the first embodiment. The solid line graph in the graphs illustrated in FIG. 7 is a combination of the sound pressures of the respective frequencies emitted by the information processors 30 to 30b when the rotation speeds of the respective cooling fans 33 to 33b are made the same, and the dotted line graph is a combination of the sound pressures of the respective frequencies emitted by the information processors 30 to 30b when the rotation speeds of the respective cooling fans 33 to 33b are displaced from each other. (D) in FIG. 7 indicates the peak of a waveform obtained by combining the sound pressures of the respective frequencies emitted by the information processors 30 to 30b.

As indicated by the dotted line graph in FIG. 7, when the information processors 30 to 30b are the same processors, and when the rotation speeds of the respective cooling fans 33 to 33b are the same, the sound pressures of the respective frequencies emitted by the information processors 30 to 30b have the same characteristics, thus causing the combined waveform to be further emphasized due to the overlapping of the peaks of the same frequency, thereby producing noise. As indicated by the dotted line graph in FIG. 7, a part whose difference of a peak value is large in each frequency domain causes harsh sound, that is, noise.

In contrast, as indicated by the solid line graph in FIG. 7, when the sound pressures of the respective frequencies emitted by the information processors 30 to 30b are different from each other, a waveform obtained by combining them is smoothed without the peaks being overlapped, thus making it possible to prevent harsh sound generated by the fact that the sound pressure level of a sound of a specific frequency surpasses the sound pressure levels of sounds of other frequencies.

Figure 8:
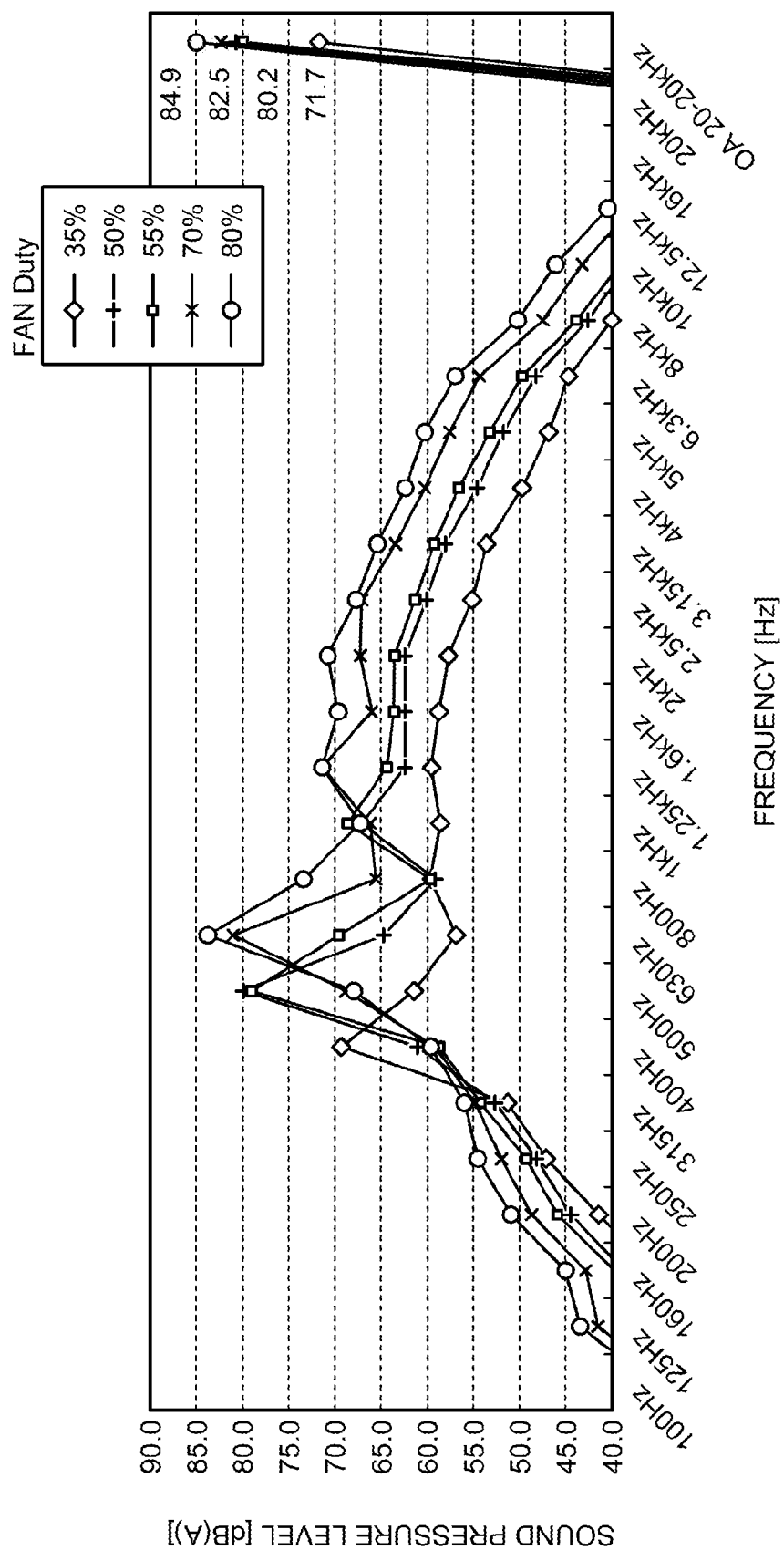
FIG. 8 is a graph for illustrating examples of sounds emitted by the front side of an information processor according to the first embodiment.
Figure 9:
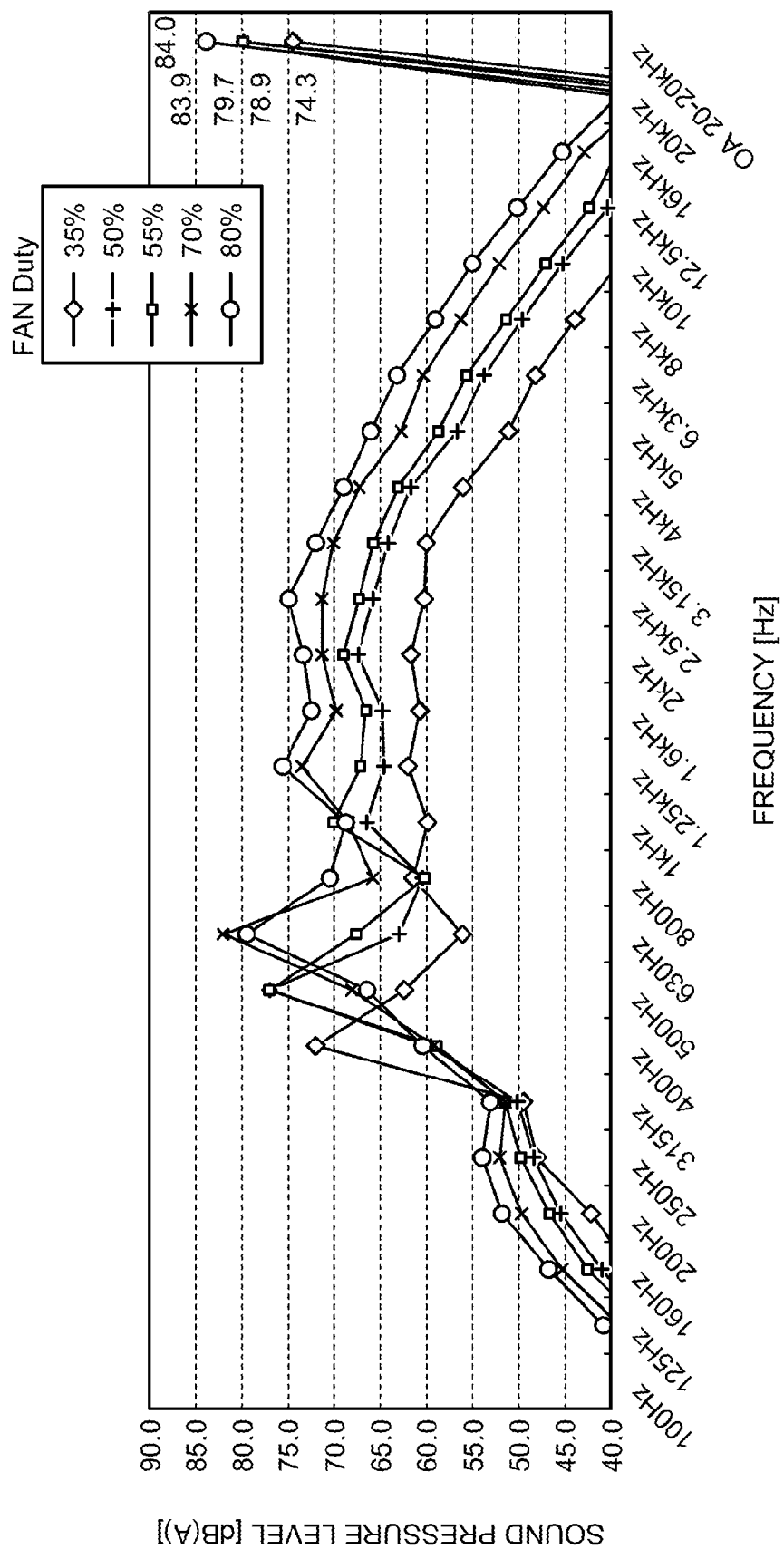
FIG. 9 is a graph for illustrating examples of sounds emitted by the back side of the information processor according to the first embodiment.

Described next with reference to FIG. 8 and FIG. 9 is a point that the frequency the peak of a sound emitted by a cooling fan changes. FIG. 8 is a graph for illustrating examples of sounds emitted by the front side of an information processor according to the first embodiment. FIG. 9 is a graph for illustrating examples of sounds emitted by the back side of the information processor according to the first embodiment. The horizontal axes of the graphs illustrated in FIG. 8 and FIG. 9 indicate frequency (Hz), and the vertical axes thereof indicate sound pressure level (dB(A)).

FIG. 8 illustrates the frequency characteristics of sounds emitted by the front side of the information processor 30 when FAN duty, which is the duty ratio of a pulse that drives the cooling fan 33, is changed. Specifically, FIG. 8 illustrates the frequency characteristics of sounds emitted by the front side of the information processor 30 when the FAN Duty of the cooling fan is changed in accordance with "35%," "50%," "55%," "70%", and "80%." There is correlation between FAN Duty and the rotation speed of the cooling fan that the larger FAN Duty, the higher the rotation speed of the cooling fan.

For example, in the example illustrated in FIG. 8, when FAN Duty is "80%," a sound of nearly 630 Hz is the loudest, and when FAN Duty is "35%," a sound of nearly 400 Hz is the loudest. In the example illustrated in FIG. 8, the larger FAN Duty, the larger the peak value of the sound pressure level emitted by the information processor 30.

FIG. 9 illustrates the frequency characteristics of sounds emitted by the back side of the information processor 30 when FAN Duty is changed. Specifically, FIG. 9 illustrates the frequency characteristics of sounds emitted by the back side of the information processor 30 when the FAN Duty of the cooling fan is changed in accordance with "35%," "50%," "55%," "70%", and "80%." Also in the example illustrated in FIG. 9, when FAN Duty is "80%," a sound of nearly 630 Hz is the loudest, and when FAN Duty is "35%," a sound of nearly 400 Hz is the loudest. Also in the example illustrated in FIG. 9, the larger FAN Duty, the larger the peak value of the sound pressure level emitted by the information processor 30.

Given this situation, when the rotation speeds of the cooling fans of the respective information processors are made the same, an information processing system superimposes noises of the same frequency and produces a further louder noise. The information processing system increases the peak value of the sound pressure level of the superimposed noise, as the rotation speeds of the cooling fans of the respective information processors are increased. In contrast, the information processing system 1 changes the rotation speeds of the respective cooling fans 33 to 33b, thereby enabling the peaks of sounds emitted by the respective information processors 30 to 30b to be displaced to different frequencies. As a result of this, the information processing system 1 can reduce harsh sound, that is, noise.

The information processing system 1 collects the temperatures of the respective information processors 30 to 30b, and if the temperature of any information processor is higher than a predetermined threshold, determines that there is a problem with temperature. The information processing system 1 measures sounds emitted by the respective information processors 30 to 30b, and if a sound pressure level at any frequency component is larger than a predetermined threshold or if the peak value of the frequency components is larger than a predetermined threshold, determines that there is a problem with sound.

If determining that there is a problem with temperature, the information processing system 1 increases the rotation speeds of the respective cooling fans 33 to 33b. If there is no problem with temperature and if there is a problem with sound, the information processing system 1 decreases the rotation speeds of the respective cooling fans 33 to 33b. The information processing system 1 therefore can prevent abnormalities caused by an increase in the temperatures of the respective information processors 30 to 30b, and if there is a margin of the temperatures of the respective information processors 30 to 30b, decreases the rotation speeds of the respective cooling fans 33 to 33b to reduce the magnitude of sound.

The information processing system 1 includes the rotation speed tables with rotation speeds changed stepwise and changes a rotation speed table to be used in accordance with the temperatures of the respective information processors 30 to 30b and the sounds emitted by the respective information processors 30 to 30b, thereby achieving optimum control of the cooling fans. In other words, the information processing system 1 successively tries the settings of the respective rotation speed tables and selects a rotation speed table through which no problem with temperature and sound occurs, thereby achieving optimum control of the cooling fans.

The information processing system 1 stores the set respective rotation speed patterns, the temperature information, and the sound information in the temperature sound storage unit 18 at any time. Because of this, the information processing system 1 can cause a user to recognize the temperatures of the respective information processors 30 to 30b and the sounds emitted by the respective information processors 30 to 30b in the respective rotation speed patterns. As a result of this, rotation speed tables suitable for the information processing system 1 can be generated based on the information stored in the temperature sound storage unit 18, thereby achieving optimum control of the cooling fans 33 to 33b.

For example, the temperature information collecting unit 12, the temperature analyzer 13, the sound information collecting unit 14, the sound analyzer 15, the fan rotation speed determining unit 16, the fan rotation speed setting unit 17, the temperature measuring units 31 to 31b, and the fan rotation speed controllers 32 to 32b are electronic circuits. As examples of the electronic circuits, adopted are integrated circuits such as an application specific integrated circuit (ASIC) and a field programmable gate array (FPGA).

The fan rotation speed table storage unit 11 and the temperature sound storage unit 18 are semiconductor memory devices such as a random access memory (RAM), a read only memory (ROM), and a flash memory or storage devices such as a hard disk.

[Processing of Monitoring Server 10]

Figure 10:
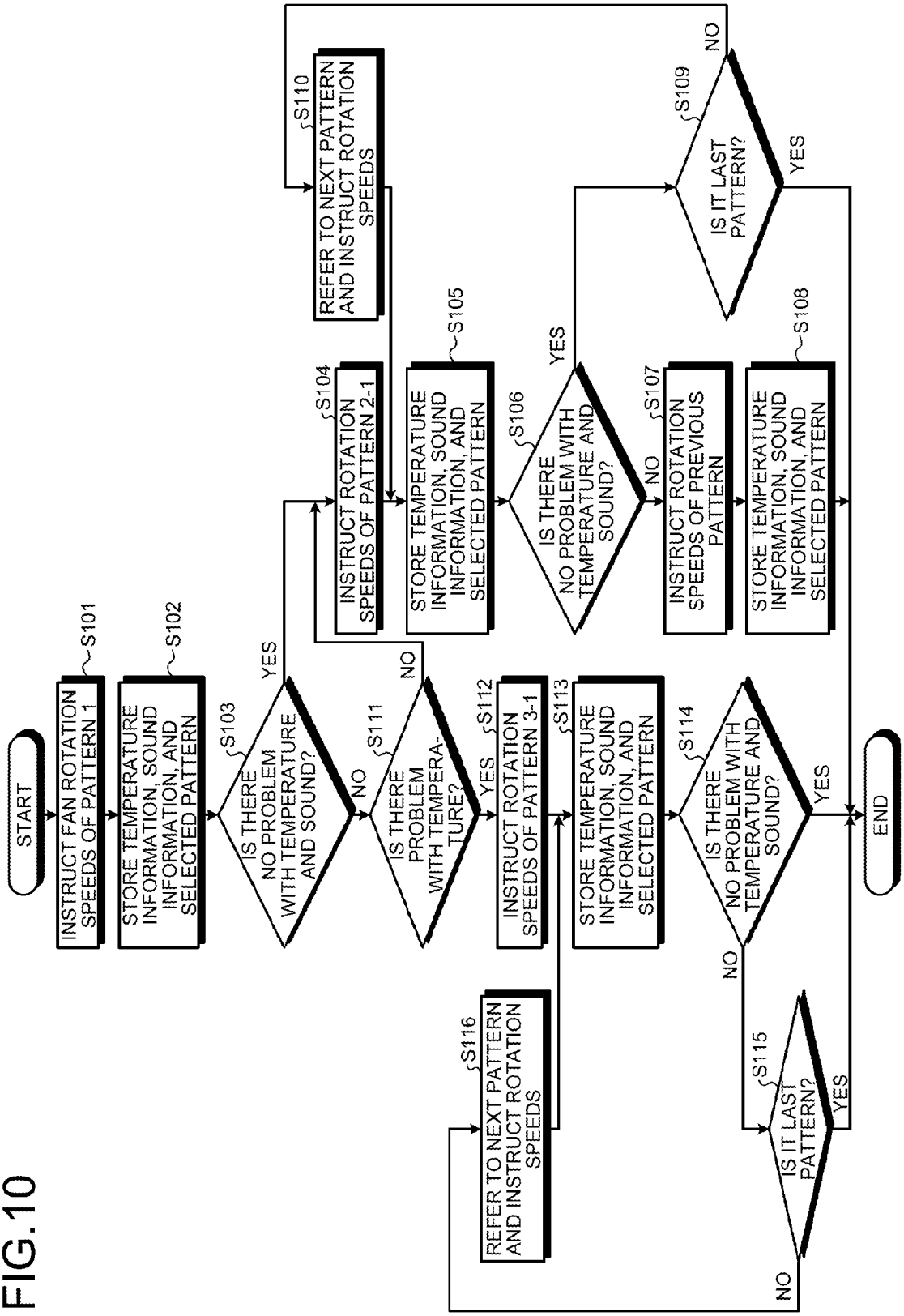
FIG. 10 is a flowchart for illustrating an example of processing executed by a monitoring server according to the first embodiment.

Described next with reference to FIG. 10 is an example of processing executed by the monitoring server 10. FIG. 10 is a flowchart for illustrating an example of processing executed by a monitoring server according to the first embodiment. In the example illustrated in FIG. 10, this monitoring server 10 starts the processing with the starting up of the information processing system 1 as a trigger.

First, the monitoring server 10 instructs the rotation speeds of the respective cooling fans 33 to 33b listed in the rotation speed table of "Pattern 1" 11a to the respective fan rotation speed controllers 32 to 32b (Step S101). The monitoring server 10 then waits until the environment of the information processing system 1 is stabilized and stores therein the temperature information, the sound information, and the set pattern (Step S102).

The monitoring server 10 then determines whether there is any problem with temperature and sound (Step S103). In other words, the monitoring server 10 determines whether there is any information processor whose temperature is higher than the predetermined threshold and determines whether a sound whose sound pressure level is higher than the predetermined threshold was measured or whether the peak value of the frequency components is higher than the predetermined threshold. If determining that there is no problem with temperature and sound (Yes at Step S103), the monitoring server 10 refers to the rotation speed table of "Pattern 2-1" 11b, which is the first pattern of "Group 2," and sets the rotation speeds of the respective cooling fans 33 to 33b (Step S104).

The monitoring server 10 then waits until the environment of the information processing system 1 is stabilized and stores therein the temperature information, the sound information, and the set pattern (Step S105). The monitoring server 10 then determines whether there is any problem with temperature and sound (Step S106). In other words, the monitoring server 10 determines whether any problem with temperature and sound has arisen owing to the decreased rotation speeds of the respective cooling fans 33 to 33b. If determining that there is any problem (No at Step S106), the monitoring server 10 refers to again the pattern set previously and instructs the rotation speeds listed by the pattern referred to (Step S107). The monitoring server 10 waits until the environment of the information processing system 1 is stabilized and stores therein the temperature information, the sound information, and the set pattern (Step S108).

If determining that there is no problem with temperature and sound (Yes at Step S106), the monitoring server 10 determines whether the pattern referred to is the last pattern of the group of "Pattern 2," that is, the pattern whose set rotation speeds are the lowest (Step S109). If determining that the pattern referred to is the last pattern of the group of "Pattern 2" (Yes at Step S109), the monitoring server 10 does not change patterns and ends the processing.

If determining that the pattern referred to is not the last pattern of the group of "Pattern 2" (No at Step S109), the monitoring server 10 refers to the next pattern of the group of "Pattern 2," that is, a pattern that sets further lower rotation speeds than the currently set pattern and instructs the rotation speeds listed by the pattern referred to (Step S110). The monitoring server 10 then waits until the environment of the information processing system 1 is stabilized again and stores the temperature information, the sound information, and the set pattern (Step S105).

If determining that there is any problem with temperature or sound (No at Step S103), the monitoring server 10 determines whether there is any problem with temperature (Step S111). If determining that there is no problem with temperature (No at Step S111), the monitoring server 10, based on that there is a problem with sound, refers to the rotation speed table of "Pattern 2-1" 11b, which is the first pattern of the group of "Pattern 2" and sets the rotation speeds of the respective cooling fans 33 to 33b (Step S104).

If determining that there is a problem with temperature (Yes at Step S111), the monitoring server 10 refers to the first pattern of the group of "Pattern 3," that is, the rotation speed table of "Pattern 3-1" 11d and instructs the rotation speeds listed in the rotation speed table of "Pattern 3-1" 11d referred to (Step S112). The monitoring server 10 then waits until the environment of the information processing system 1 is stabilized and stores therein the temperature information, the sound information, and the set pattern (Step S113). The monitoring server 10 then determines whether there is any problem with temperature and sound (Step S114), and if determining that there is no problem (Yes at Step S114), ends the processing without any change.

If determining that there is any problem with temperature or sound (No at Step S114), the monitoring server 10 determines whether the set pattern is the pattern whose rotation speeds are the highest, that is, the last pattern (Step S115). If determining that the set pattern is not the last pattern of the group of "Pattern 3" (No at Step S115), the monitoring server 10 refers to the next pattern of the group of "Pattern 3" and sets the rotation speeds of the respective cooling fans 33 to 33b (Step S116). The monitoring server 10 then waits until the environment of the information processing system 1 is stabilized and stores therein the temperature information, the sound information, and the set pattern (Step S113). If determining that there is no problem with temperature and sound (Yes at Step S114), the monitoring server 10 ends the processing without any change. If determining that the set pattern is the last pattern whose rotation speeds are the highest in the group of "Pattern 3" (Yes at Step S115), the monitoring server 10 ends the processing without any change.

Effect of First Embodiment

As described above, the information processing system 1 sets the rotation speeds of the respective cooling fans 33 to 33b of the respective information processors 30 to 30b to be different rotation speeds. Because of this, the information processing system 1 displaces the peak frequencies of the sounds emitted by the respective information processors 30 to 30b, thereby preventing the overlapping of the peaks of the sound pressure level, and can reduce the difference in the sound pressure level of the frequency components, thereby making it possible to reduce noise.

The information processing system 1 collects the temperatures of the respective information processors 30 to 30b, and if the temperature of any information processor is higher than the predetermined threshold, determines that there is a problem with temperature. The information processing system 1 measures the sounds emitted by the respective information processors 30 to 30b, and if the sound pressure level of any frequency component is larger than the predetermined threshold or if the peak value of the frequency components is larger than the predetermined threshold, determines that there is a problem with sound.

If determining that there is a problem with temperature, the information processing system 1 increases the rotation speeds of the respective cooling fans 33 to 33b, and if there is a problem with sound, the information processing system 1 decreases the rotation speeds of the respective cooling fans 33 to 33b. Because of this, the information processing system 1 can prevent abnormalities caused by an increase in the temperatures of the respective information processors 30 to 30b. If there is a margin of the temperatures of the respective information processors 30 to 30b, the information processing system 1 decreases the rotation speeds of the cooling fans to reduce the peak value of the sound pressure level.

The information processing system 1 includes the rotation speed tables with rotation speeds changed stepwise and changes a rotation speed table to be used in accordance with the temperatures of the respective information processors 30 to 30b and the sounds emitted by the respective information processors 30 to 30b, thereby achieving optimum control of the cooling fans.

The information processing system 1 stores the set respective rotation speed patterns, the temperature information, and the sound information in the temperature sound storage unit 18 at any time. Because of this, the information processing system 1 can cause a user to recognize the temperatures of the respective information processors 30 to 30b and the sounds emitted by the respective information processors 30 to 30b in the respective rotation speed patterns. As a result of this, rotation speed tables suitable for the information processing system 1 can be generated based on the information stored in the temperature sound storage unit 18, thereby achieving optimum control of the cooling fans.

The information processing system 1 includes the temperature measuring units 31 to 31b in the information processors 30 to 30b, respectively. As a result of this, the information processing system 1 can grasp the temperatures of the respective information processors 30 to 30b and prevent the occurrence of abnormalities in the information processors caused by an increase in the temperatures of the respective information processors 30 to 30b.

Second Embodiment

Figure 11:
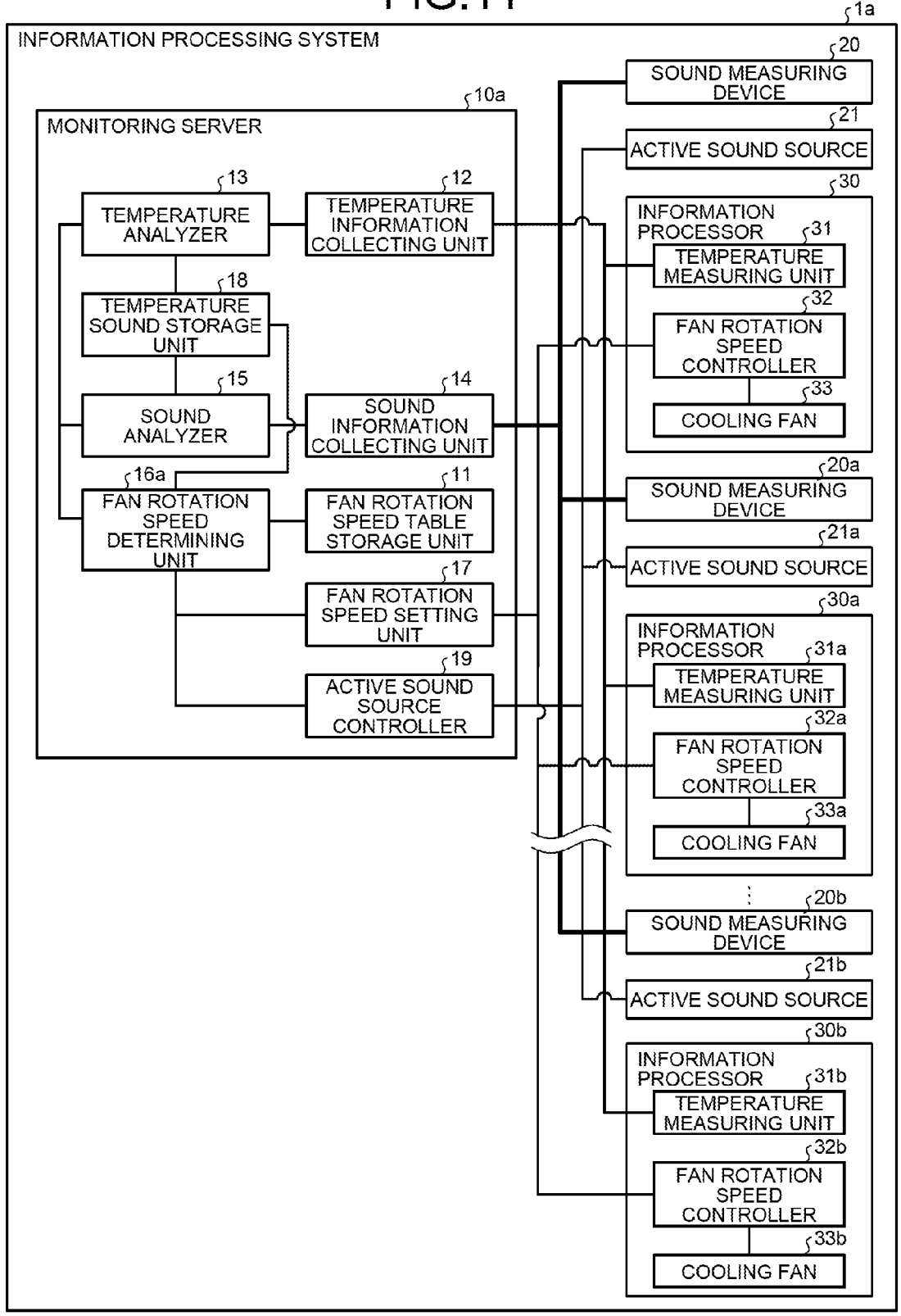
FIG. 11 is a diagram for illustrating an example of an information processing system according to a second embodiment.

A second embodiment describes an information processing system 1a that reduces noise using active sound sources. FIG. 11 is a diagram for illustrating an example of an information processing system according to the second embodiment. In the following description, the same parts as the parts of the first embodiment will be given the same reference numerals, and the description thereof will be omitted.

In the example illustrated in FIG. 11, the information processing system 1a includes a plurality of active sound sources 21 to 21b in addition to the same configuration as the first embodiment. This monitoring server 10a includes a fan rotation speed determining unit 16a and an active sound source controller 19.

The fan rotation speed determining unit 16a executes the same processing as the fan rotation speed determining unit 16 and executes processing to determine the rotation speeds of the respective cooling fans 33 to 33b. If, for any information processor, a measured temperature is higher than a predetermined threshold and if a sound pressure level is larger than a predetermined threshold or if the peak value of the sound pressure level of the frequency components is larger than a predetermined threshold, the fan rotation speed determining unit 16a executes the following processing.

Namely, the fan rotation speed determining unit 16a transmits to the active sound source controller 19 information indicating an information processor whose temperature is higher than the predetermined threshold and whose sound pressure level is larger than the predetermined threshold or whose peak value of the sound pressure levels of the frequency components is larger than the predetermined threshold and information indicating a sound acquired from a sound measuring device that measures the sound emitted by this information processor. If the measured temperature is higher than the predetermined threshold and if the sound pressure level is higher than the predetermined threshold or if the peak level of the sound pressure level of the frequency components is higher than the predetermined threshold, the fan rotation speed determining unit 16a newly selects a rotation speed table listing higher rotation speeds than the current setting.

Upon receiving the information indicating the information processor and the information indicating the measured sound from the fan rotation speed determining unit 16a, the active sound source controller 19 generates information indicating a sound with the phase of the measured sound inverted from the received information. The active sound source controller 19 transmits the generated information to an active sound source positioned in the vicinity of the information processor indicated by the received information.

Upon receiving the information indicating the sound with the phase of the measured sound inverted from the active sound source controller 19, the active sound sources 21 to 21b emit the sounds indicated by the received information. In other words, the active sound sources 21 to 21b emit sounds with the phases of the sounds measured by the respective sound measuring devices 20 to 20b inverted, thereby reducing the sound pressure level of noise.

Effect of Second Embodiment

Thus, if the measured temperature is higher than the predetermined threshold and if the sound pressure level is higher than the predetermined threshold or if the peak value of the sound pressure level of the frequency components is higher than the predetermined threshold, the information processing system 1a increases the rotation speeds of the respective cooling fans 33 to 33b, and at the same time, decreases the sound pressure level of noise using the respective active sound sources 21 to 21b. As a result of this, the information processing system 1a increases the rotation speeds of the cooling fans 33 to 33b while reducing the sound pressure level of noise to perform appropriate cooling even when the temperatures of the respective information processors 30 to 30b increase.

Third Embodiment

The first embodiment and the second embodiment describe the information processing systems 1 and 1a. However, the present embodiment is not limited thereto. Described below is another embodiment included in the present invention as a third embodiment.

(1) How to Set Cooling Fans

Figure 12:
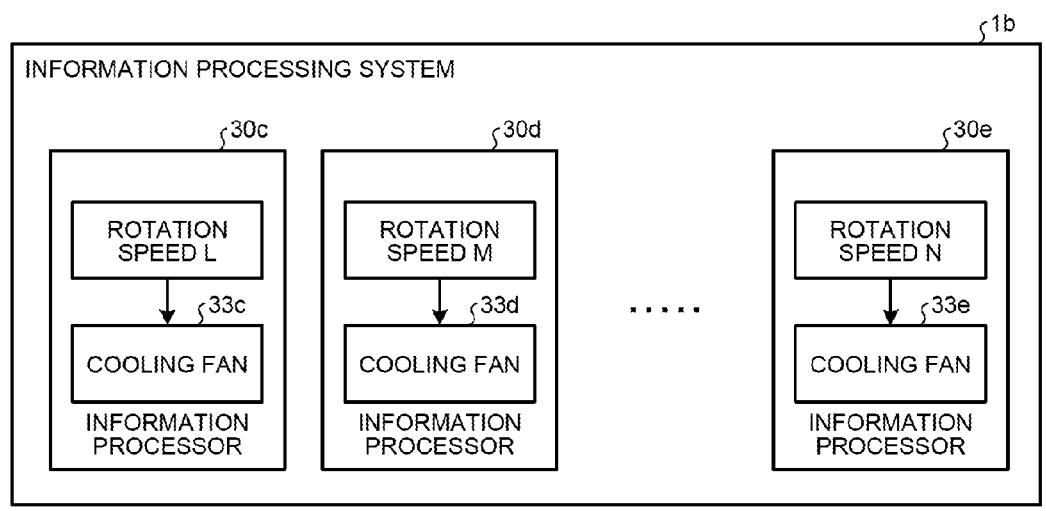
FIG. 12 is a diagram for illustrating an example of information processors according to a third embodiment.

FIG. 12 is a diagram for illustrating an example of information processors according to the third embodiment. This information processing system 1b illustrated in FIG. 12 includes a plurality of information processors 30c to 30e. The information processors 30c to 30e include cooling fans 33c to 33e, respectively. Different rotation speeds are set in advance in the respective cooling fans 33c to 33e of the respective information processors 30c to 30e. In other words, a rotation speed of "L" (rotation/second) is set in the cooling fan 33c, a rotation speed of "M" (rotation/second) is set in the cooling fan 33d, and a rotation speed of "N" (rotation/second) is set in the cooling fan 33e.

Namely, the information processing system 1b can be set by any method, as long as the rotation speeds of the respective cooling fans 33c to 33e can be set to be different rotation speeds. As illustrated in FIG. 12, fixed rotation speeds may be adopted in advance. This is because when the rotation speeds of the respective cooling fans 33c to 33e are set to be different rotation speeds, a peak of the same frequency component is not emphasized, and noise can be prevented.

(2) How to Adopt Different Rotation Speeds

Figure 13:
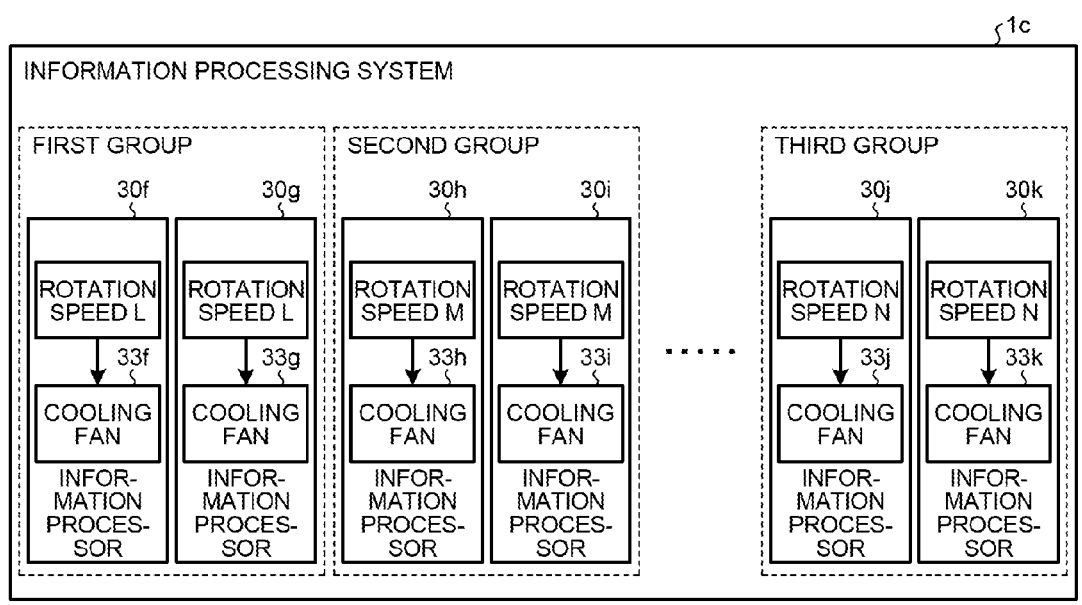
FIG. 13 is a diagram for illustrating groups of information processors according to the third embodiment.

FIG. 13 is a diagram for illustrating groups of information processors according to the third embodiment. In the example illustrated in FIG. 13, this information processing system 1c includes a plurality of information processors 30f to 30k. The information processor 30f and the information processor 30g are associated with each other as a first group, the information processor 30h and the information processor 30i are associated with each other as a second group, and the information processor 30j and the information processor 30k are associated with each other as a third group.

As illustrated in FIG. 13, the information processing system 1c may associate a plurality of information processors with each other as one group and set different rotation speeds in the respective groups. In other words, the information processing system 1c sets a rotation speed of "L" (rotation/second) in the cooling fans 33f and 33g of the information processors 30f and 30g included in the first group and sets a rotation speed of "M" (rotation/second) in the cooling fans 33h and 33i of the information processors 30h and 30i included in the second group.

The information processing system 1c sets a rotation speed of "N" (rotation/second) in the cooling fans 33j and 33k of the information processors 30j and 30k included in the third group. Thus, when associating a plurality of information processors with each other as one group and setting different rotation speeds in the respective groups, the information processing system 1c can perform the setting of the cooling fans 33f to 33k easily.

Figure 14:
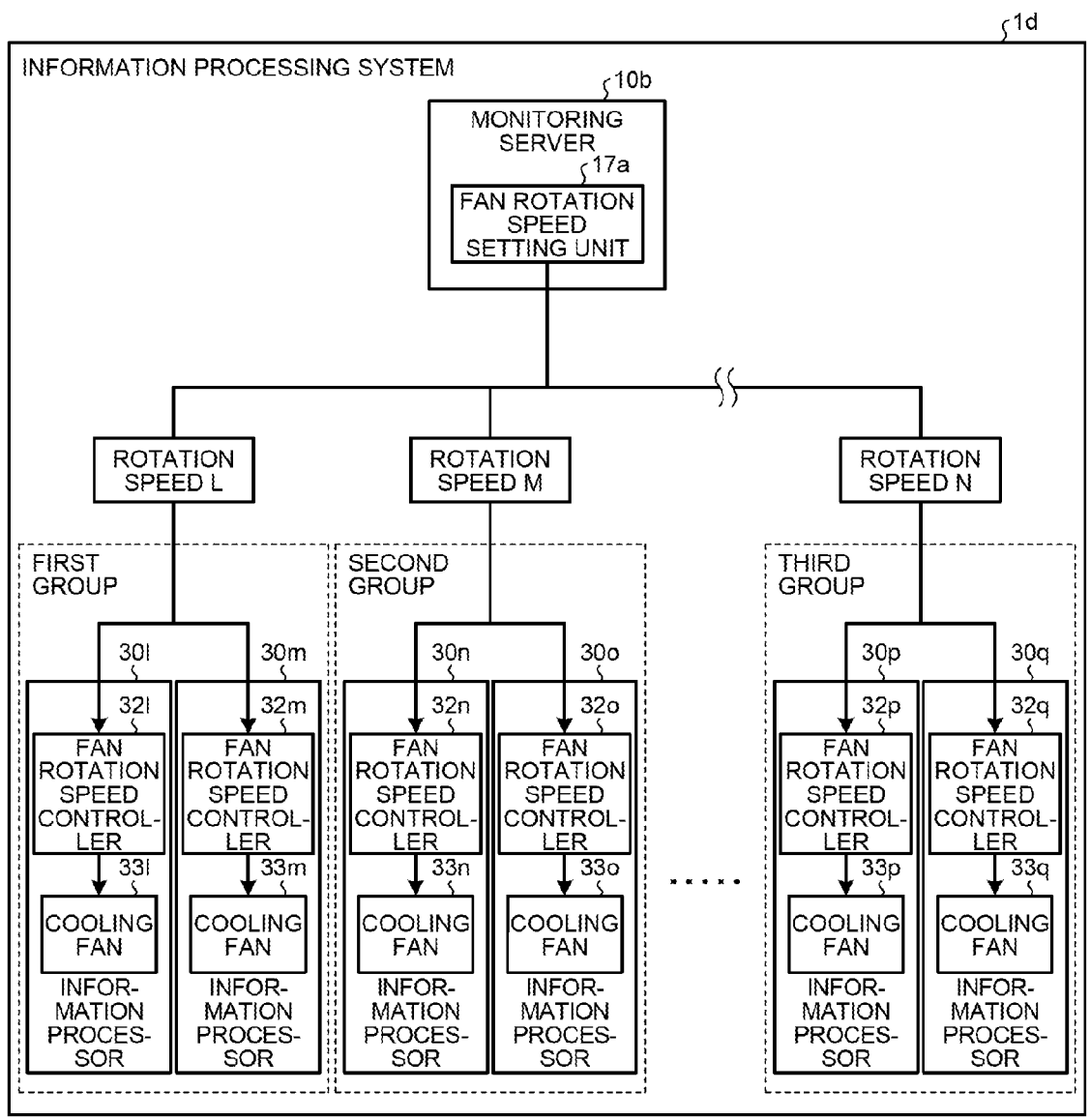
FIG. 14 is a diagram for illustrating processing to set rotation speeds in groups of information processors according to the third embodiment.

FIG. 14 is a diagram for illustrating processing to set rotation speeds in groups of information processors according to the third embodiment. In the example illustrated in FIG. 14, this information processing system 1d associates information processors 30l and 30m with each other as a first group, associates information processors 30n and 30o with each other as a second group, and associates information processors 30p and 30q with each other as a third group. Because fan rotation speed controllers 32l to 32q and cooling fans 33l to 33q of the respective information processors 30l to 30q have the same functions as the fan rotation speed controllers and the cooling fans according to the first embodiment, the description thereof will be omitted below.

The information processing system 1d includes a monitoring server 10b having the same function as the monitoring server 10. The monitoring server 10b includes a fan rotation speed setting unit 17a having the same function as the fan rotation speed setting unit 17. The fan rotation speed setting unit 17a sets different rotation speeds in the respective groups. For example, the fan rotation speed setting unit 17a sets a rotation speed of "L" (rotation/second) in the cooling fans 33l and 33m of the information processors 30l and 30m of the first group and sets a rotation speed of "M" (rotation/second) in the cooling fans 33n and 33o of the information processors 30n and 30o of the second group. The fan rotation speed setting unit 17a sets a rotation speed of "N" (rotation/second) in the cooling fans 33p and 33q of the information processors 30p and 30q of the third group.

Thus, by setting the rotation speeds of the respective cooling fans 33l to 33q through external instructions, the rotation speeds of the respective cooling fans 33l to 33q can be changed through instructions from outside the processors even after the introduction and start of operation of the information processing system 1d.

(3) Priority

The information processing system 1 increases the rotation speeds of the respective cooling fans 33 to 33b when the temperature of any of the information processors becomes higher than the threshold. However, an embodiment is not limited thereto. For example, an information processing system may set temperature priority information indicating whether temperature is prioritized according to the positions at which the respective information processors are installed, and in accordance with the temperature priority information, may control the rotation speeds of the cooling fans of the respective information processors.

Figure 15A:
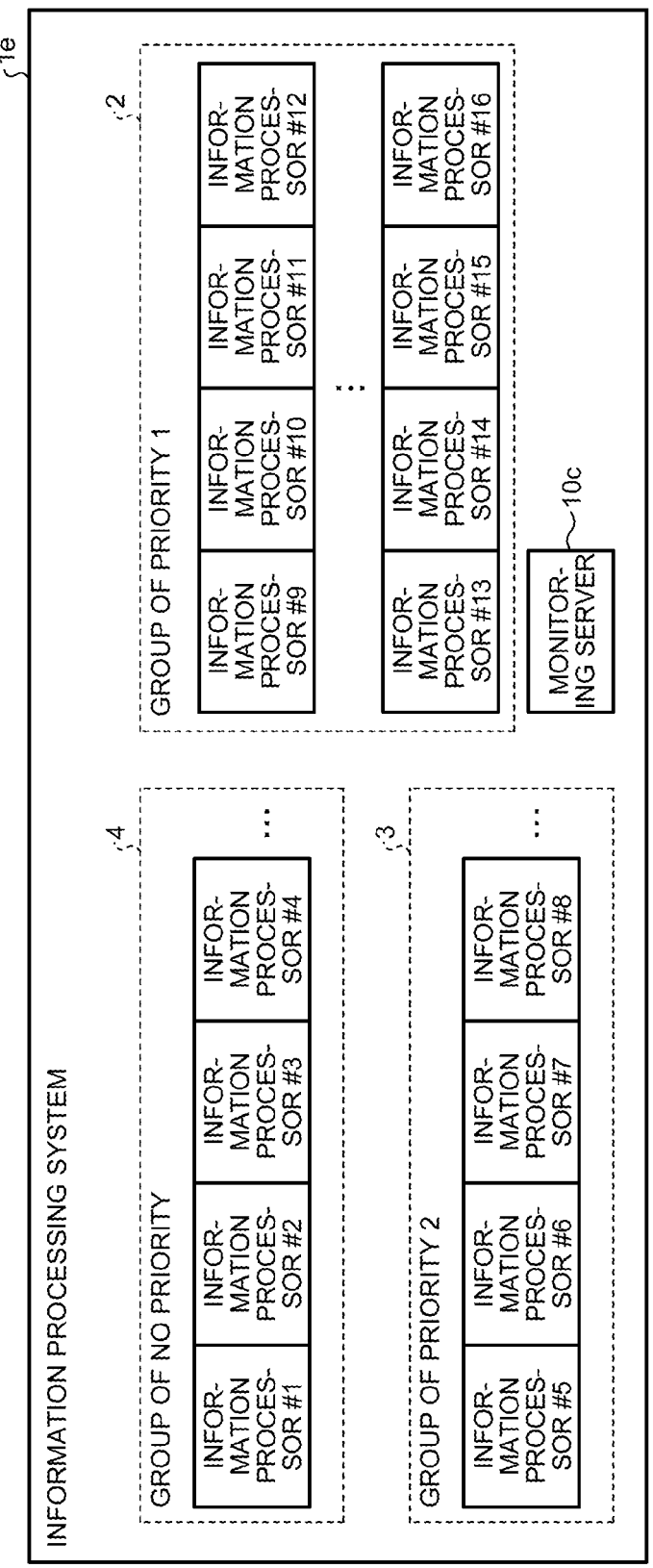
FIG. 15a is a diagram for illustrating the priorities of information processors.

FIG. 15a is a diagram for illustrating the priorities of information processors. In the example illustrated in FIG. 15a, this information processing system 1e includes a plurality of information processors #1 to #16 and a monitoring server 10c. The information processing system 1e sets a group 2 of priority 1, a group 3 of priority 2, and a group 4 of no priority according to the positions at which the respective information processors are installed. The groups 2 to 4 may correspond to the above first group to third group, respectively. The information processing system 1e may include information processors other than the information processors #1 to #16.

The information processors #9 to #16 included in the group 2 of priority 1 are installed at positions where noise does not matter, and temperature priority information of priority 1 that gives temperature first priority is set therein. The information processors #5 to #8 included in the group 3 of priority 2 are installed at positions where noise is desired to be suppressed to some extent, and temperature priority information that gives temperature priority is set therein. The information processors #1 to #4 included in the group 4 of no priority are installed at positions where noise matters, and temperature priority information that gives temperature priority is not set therein.

Figure 15B:
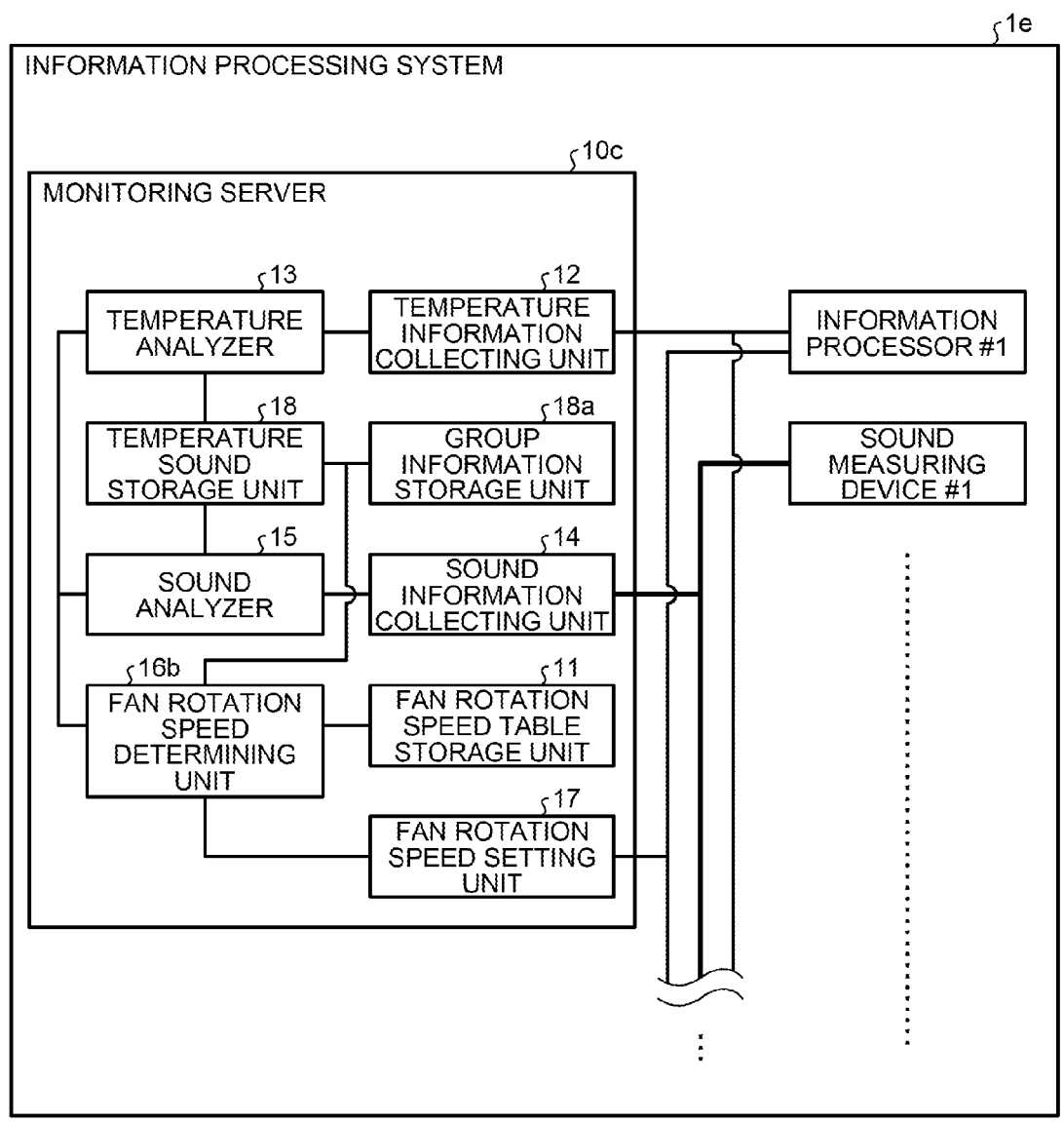
FIG. 15b is a diagram for illustrating an example of an information processing system according to the third embodiment.

FIG. 15b is a diagram for illustrating an example of an information processing system according to the third embodiment. Because units 11 to 15, 17, and 18 of FIG. 15b exhibit the same functions as the units 11 to 15, 17, and 18 of the monitoring server 10, the description thereof will be omitted. The monitoring server 10c includes a fan rotation speed determining unit 16b and a group information storage unit 18a.

The group information storage unit 18a stores therein group information indicating in which group the information processors #1 to #16 are included. FIG. 15c is a view for illustrating an example of group information according to the third embodiment. For example, in the example illustrated in FIG. 15c, the group information storage unit 18a stores therein information indicating the information processors #9 to #16 as the group of priority 1, stores therein information indicating the information processors #5 to #8 as the group of priority 2, and stores therein information indicating the information processors #1 to #4 as the group of no priority.

The fan rotation speed determining unit 16b determines a group including the information processors #1 to #16 based on the group information stored in the group information storage unit 18a. For example, based on the group information illustrated in FIG. 15c, the fan rotation speed determining unit 16b determines that the information processor #9 is included in the group of priority 1, determines that the information processor #5 is included in the group of priority 2, and determines that the information processor #4 is included in the group of no priority. The fan rotation speed determining unit 16b determines the rotation speeds of cooling fans that are different by the respective determined groups. The fan rotation speed setting unit 17 then sets the rotation speeds of the cooling fans that are different by the respective groups determined by the fan rotation speed determining unit 16b.

FIG. 15d is a view for illustrating rotation speeds that a monitoring server according to the third embodiment sets in cooling fans of the information processors of the respective groups. For example, in the example illustrated in FIG. 15d, if the temperature measured for the information processor #9 of the group of priority 1 is 30 degrees or more, the monitoring server 10c sets the rotation speed of the cooling fan to be "5000" (rotation/second). If the temperature measured for the information processor #9 of the group of priority 1 is 25 degrees or more and less than 30 degrees, the monitoring server 10*c* sets the rotation speed of the cooling fan to be "4000" (rotation/second). If the temperature measured for the information processor #9 of the group of priority 1 is less than 25 degrees, the monitoring server 10*c* sets the rotation speed of the cooling fan to be "3000" (rotation/second).

If the temperature measured for the information processor #5 of the group of priority 2 is 30 degrees or more, the monitoring server 10*c* sets the rotation speed of the cooling fan to be "4000" (rotation/second). If the temperature measured for the information processor #5 of the group of priority 2 is less than 30 degrees, the monitoring server 10*c* leaves the rotation speed set at startup. For the information processor #4 of the group of no priority, the monitoring server 10*c* leaves the rotation speed set at startup regardless of the measured temperature.

Thus, the monitoring server 10*c* sets the temperature priority information according to the positions at which the information processors #1 to #16 are installed, thereby performing optimum control of cooling fans according to the positions at which the information processors #1 to #16 are installed.

Figure 16:
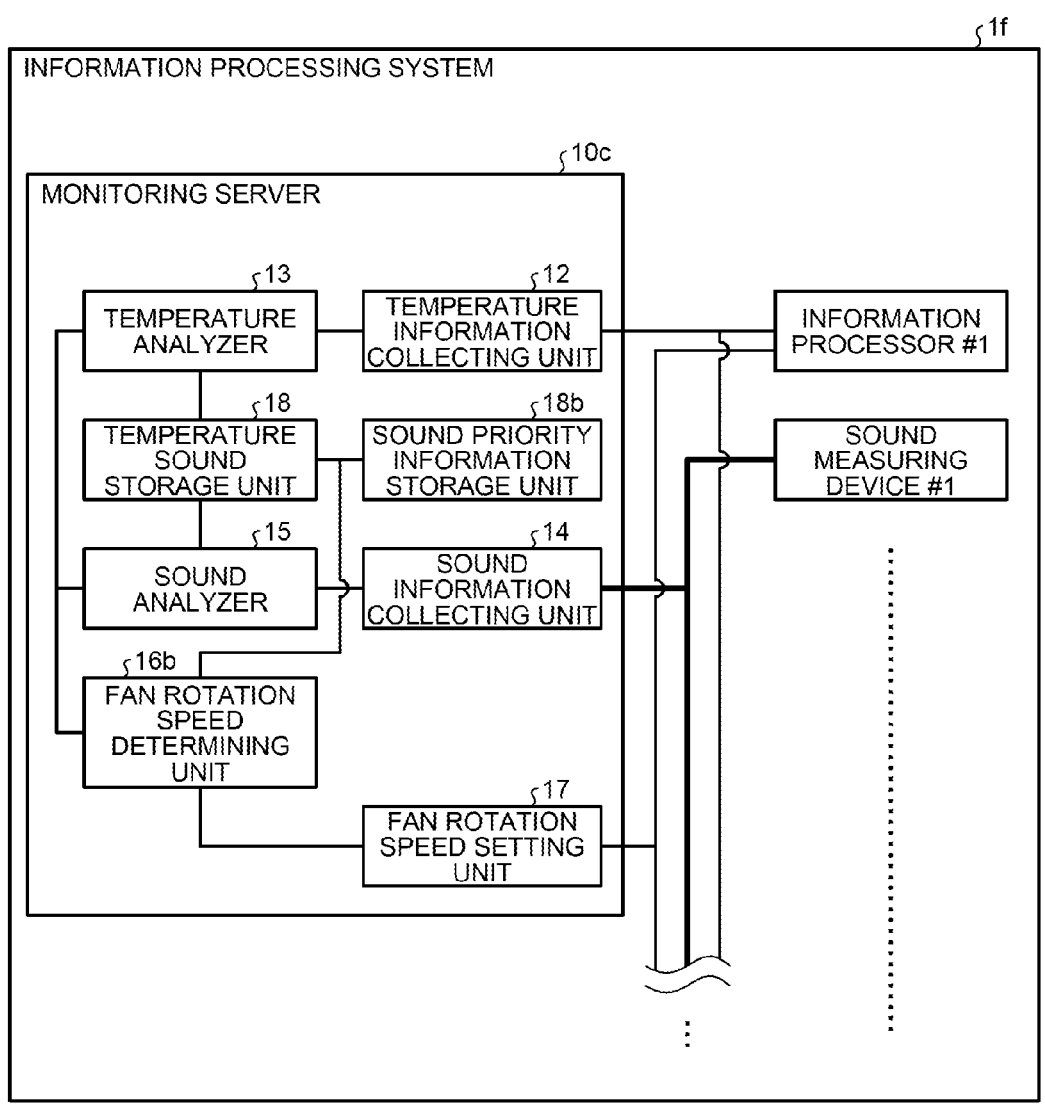
FIG. 16 is a diagram for illustrating an example of an information processing system that sets sound priority information.

An information processing system may set sound priority information indicating that the prevention of noise is prioritized. FIG. 16 is a diagram for illustrating an example of an information processing system that sets sound priority information. This information processing system 1*f* includes, as is the case with the information processing system 1*e*, a plurality of information processors #1 to #16, and units 12 to 15, 17, and 18 of a monitoring server 10*d* exhibit the same functions as the units 12 to 15, 17, and 18 of the monitoring server 10*c*. The information processing system 1*f* includes a sound priority information storage unit 18*b*.

The sound priority information storage unit 18*b* stores therein a plurality of information processors of the information processing system 1*f* in association with each other. For example, the sound priority information storage unit 18*b* stores therein information indicating the information processors #9 to #16 included in the group 2 of priority 1 illustrated in FIG. 15*a* and sound priority information of priority 1 in association with each other. The sound priority information storage unit 18*b* stores therein information indicating the information processors #5 to #8 included in the group 3 of priority 2 illustrated in FIG. 15*a* and sound priority information of priority 2 in association with each other. The sound priority information storage unit 18*b* stores therein information indicating the information processors #1 to #4 included in the group 4 of no priority illustrated in FIG. 15*a* and information indicating that sound is not prioritized in association with each other.

The fan rotation speed determining unit 16*b* refers to the sound priority information storage unit 18*b* for the respective information processors #1 to #16 and determines in which group the respective information processors #1 to #16 are included. The fan rotation speed determining unit 16*b* determines different rotation speeds according to the determined group.

Figure 17:
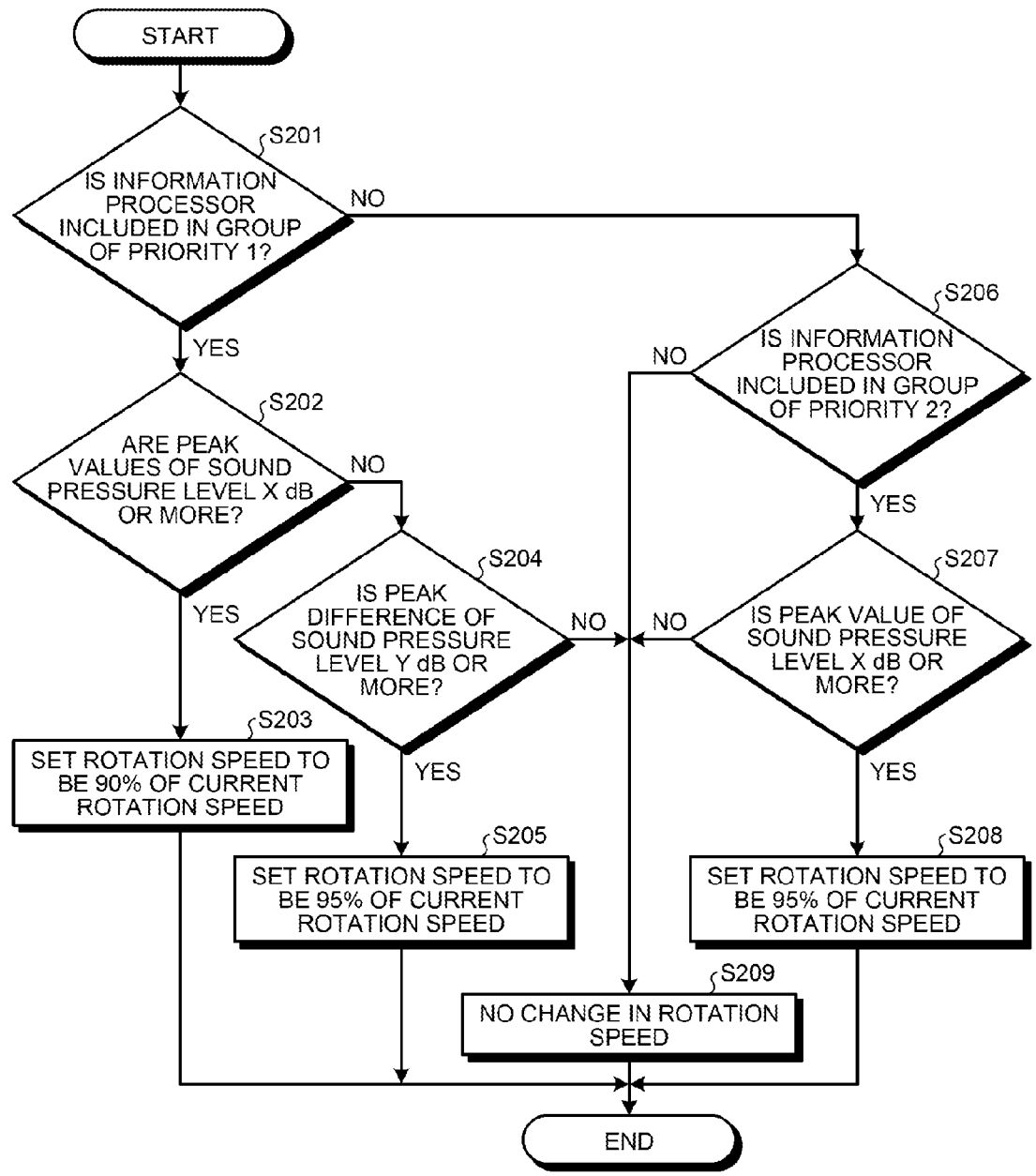
FIG. 17 is a flowchart for illustrating an example of processing that a monitoring server 10d according to the third embodiment executes based on sound priority information.

FIG. 17 is a flowchart for illustrating an example of processing that the monitoring server 10*d* according to the third embodiment executes based on sound priority information. The monitoring server 10*d* executes the following processing for the respective information processors #1 to #16. "X" and "Y" in the following description are predetermined thresholds set in advance.

First, the monitoring server 10*d* refers to the sound priority information storage unit 18*b* to determine whether an information processor to be processed is included in the group of priority 1 (Step S201). In other words, the monitoring server 10*d* determines whether the sound priority information of priority 1 is set in the information processor. If determining that the information processor is included in the group of priority 1 (Yes at Step S201), the monitoring server 10*d* determines whether, among peaks of the sound pressure level emitted by the information processor, the maximum peak value and the minimum peak value are "X" dB or more (Step S202). If determining that the peak values of the sound pressure level are "X" dB or more (Yes at Step S202), the monitoring server 10*d* sets the rotation speed of the cooling fan of the information processor to be 90 percent of the current rotation speed (Step S203) and ends the processing.

If determining that the peak values of the sound pressure level are less than "X" dB (No at Step S202), the monitoring server 10*d* determines whether a peak difference, which is the difference between the maximum value and the minimum value among the peak values, is "Y" dB or more (Step S204). If determining that the peak difference of the sound pressure level is "Y" dB or more (Yes at Step S204), the monitoring server 10*d* sets the rotation speed of the cooling fan of the information processor to be 95 percent of the current rotation speed (Step S205) and ends the processing. If determining that the peak difference of the sound pressure level is less than "Y" dB (No at Step S204), the monitoring server 10*d* does not change the rotation speed of the cooling fan (Step S209) and ends the processing.

If determining that the information processor is not included in the group of priority 1 (No at Step S201), the monitoring server 10*d* determines whether it is included in the group of priority 2 (Step S206). In other words, the monitoring server 10*d* determines whether sound priority information of priority 2 is set in the information processor. If determining that the information processor is included in the group of priority 2 (Yes at S206), the monitoring server 10*d* determines whether the peak value of the sound pressure level is "X" dB or more (Step S207). If determining that the peak value of the sound pressure level is "X" dB or more (Yes at Step S207), the monitoring server 10*d* sets the rotation speed of the cooling fan to be 95 percent of the current rotation speed (Step S208) and ends the processing.

If determining that the peak value of the sound pressure level is less than "X" dB (No at Step S207), the monitoring server 10*d* leaves the rotation speed of the cooling fan unchanged (Step S209) and ends the processing. If determining that the information processor is not included in the group of priority 2 (No at Step S206), the monitoring server 10*d* leaves the rotation speed unchanged and ends the processing.

(4) Installation Positions of the Sound Measuring Devices

In the first embodiment, the information processing system 1 installs the sound measuring devices 20 to 20*b* in the vicinity of the respective information processors 30 to 30*b* in order to measure the sounds emitted by the respective information processors 30 to 30*b*. However, an embodiment is not limited thereto.

Figure 18:
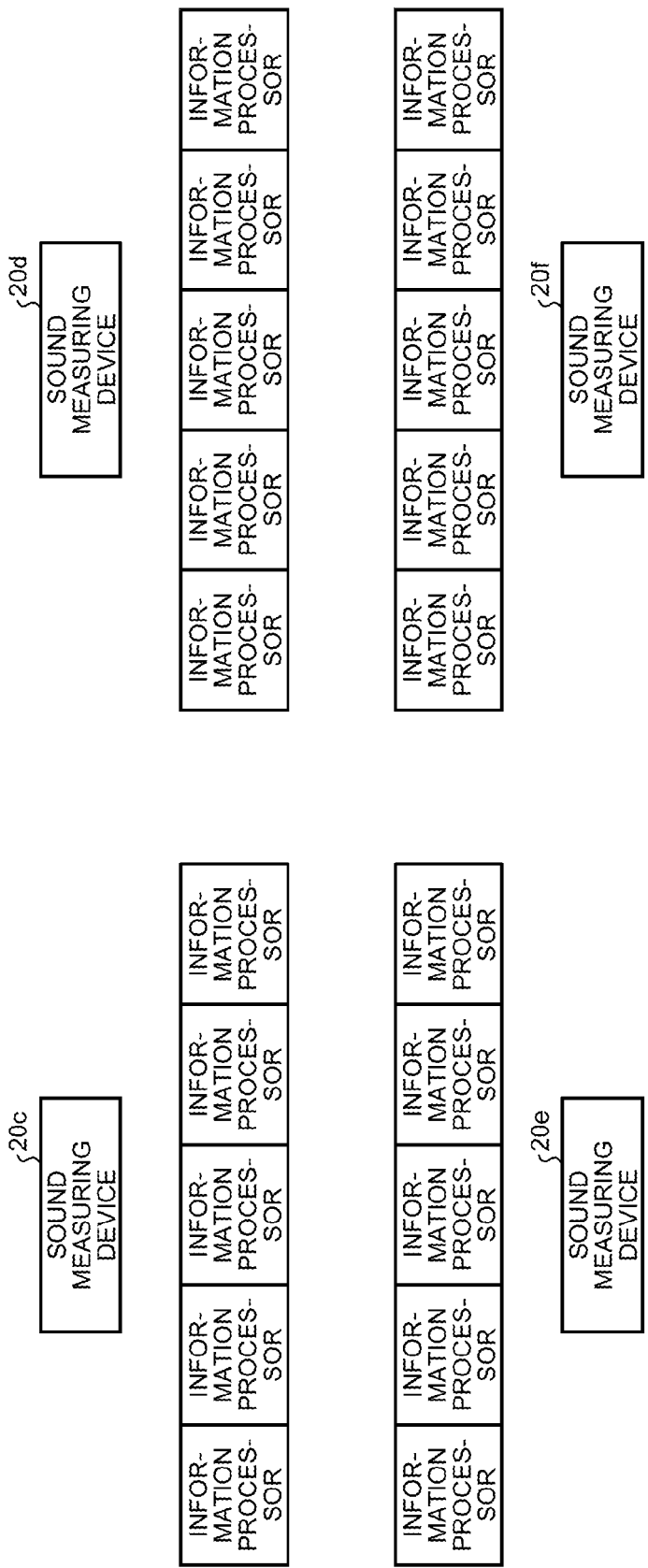
FIG. 18 is a first diagram for illustrating the installation positions of sound measuring devices.
Figure 19:
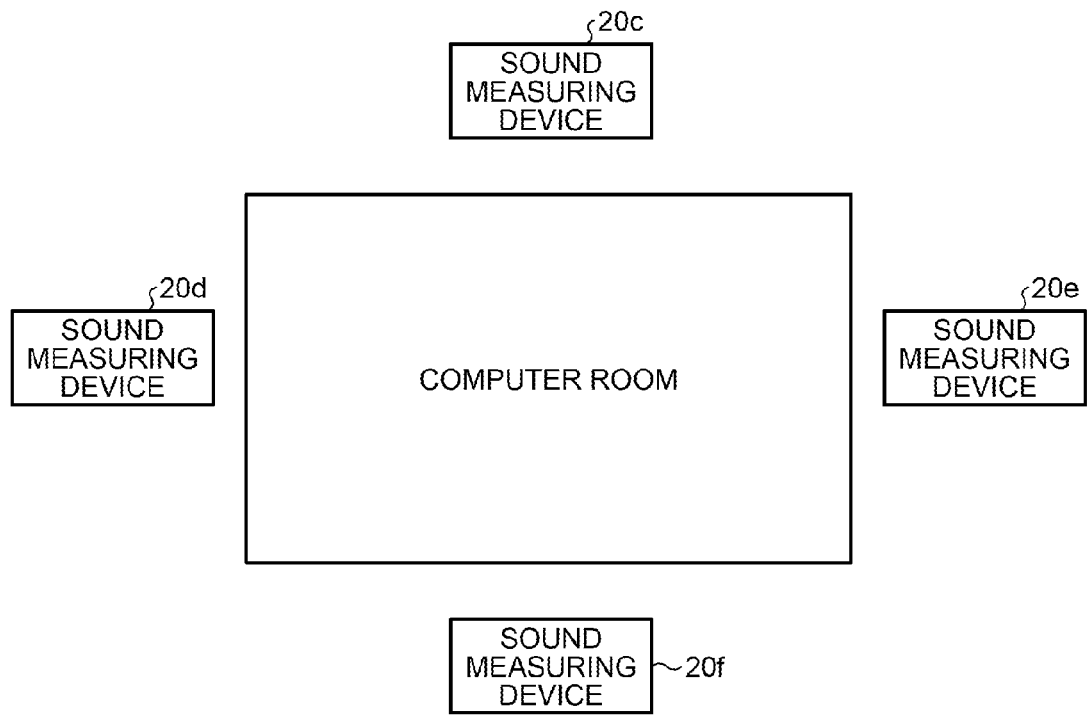
FIG. 19 is a second diagram for illustrating the installation positions of the sound measuring devices.
Figure 20:
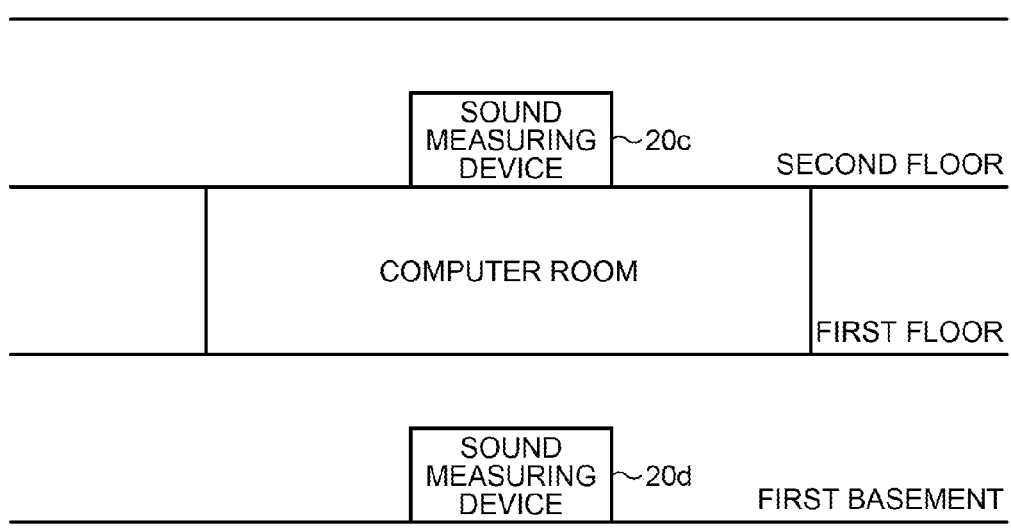
FIG. 20 is a third diagram for illustrating the installation positions of the sound measuring devices.

FIG. 18 is a first diagram for illustrating the installation positions of sound measuring devices. As illustrated in FIG. 18, sound measuring devices 20*c* to 20*f* each may be installed at positions to measure sounds emitted by a plurality of information processors. FIG. 19 is a second diagram for illustrating the installation positions of the sound measuring devices. For example, as illustrated in FIG. 19, the sound measuring devices 20c to 20f may be installed outside a computer room in which a plurality of information processors are installed. FIG. 20 is a third diagram for illustrating the installation positions of the sound measuring devices. As illustrated in FIG. 20, when a computer room is installed on the first floor of a building, the sound measuring device 20c may be installed on the second floor, and the sound measuring device 20d may be installed on the first basement.

Figure 21:
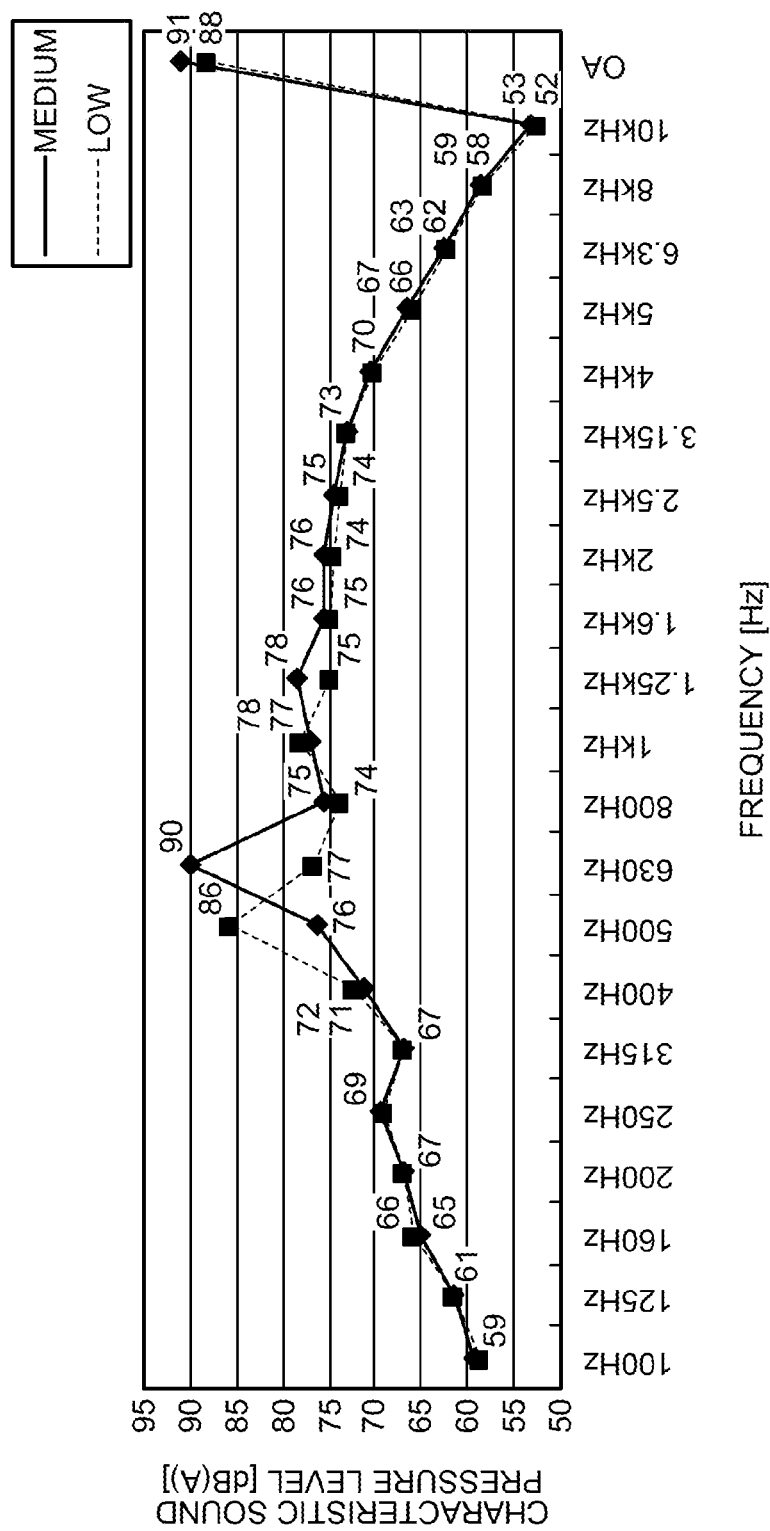
FIG. 21 is a graph for illustrating the frequency components of sounds measured inside a computer room.
Figure 22:
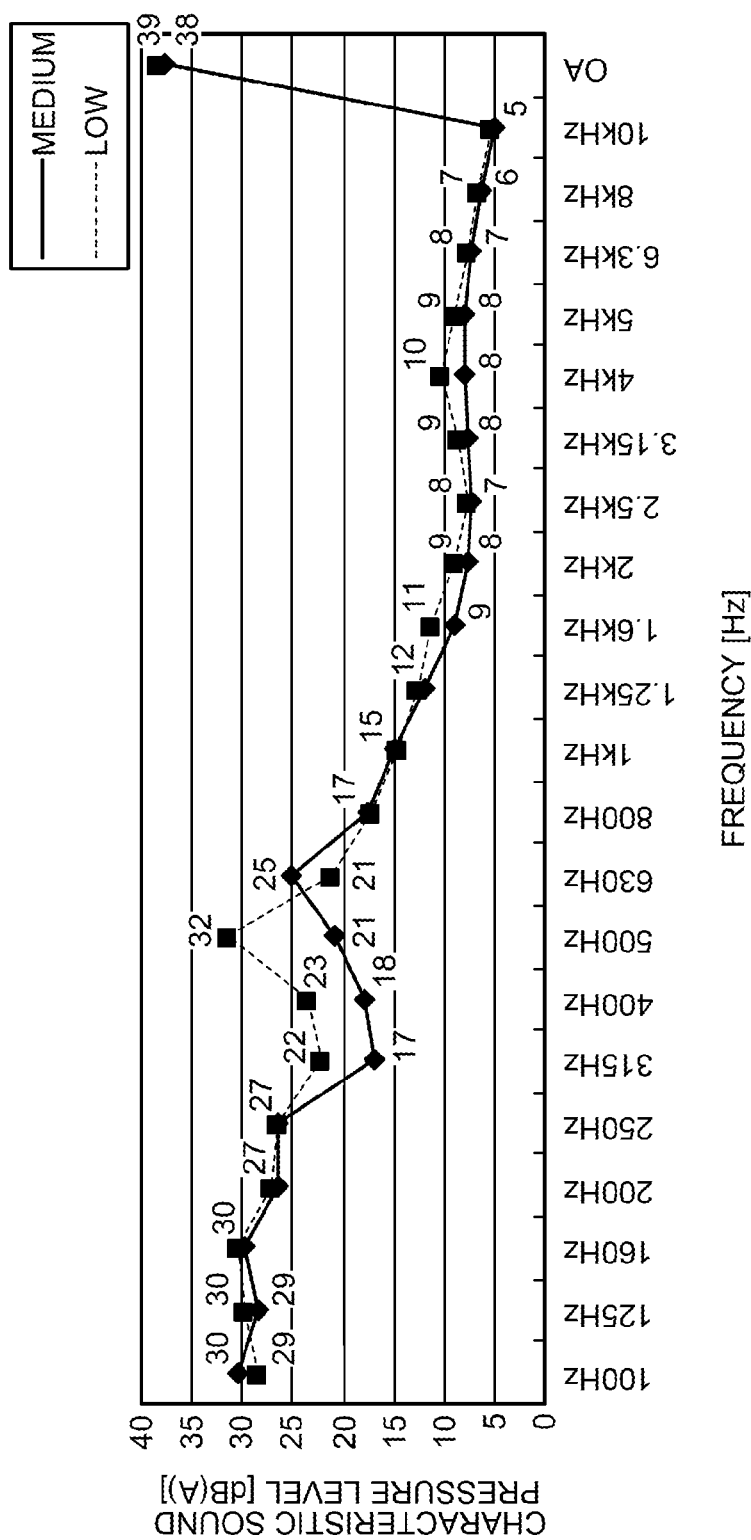
FIG. 22 is a graph for illustrating the frequency components of sounds measured outside the computer room.

Namely, unexpected noise may transmit to a room adjacent to a computer room or rooms on the upper floor and lower floor of the computer room according to the structure of a building. Such unexpected noise will be described with reference to FIG. 21 and FIG. 22. FIG. 21 is a graph for illustrating the frequency components of sounds measured inside a computer room. FIG. 22 is a graph for illustrating the frequency components of sounds measured outside the computer room. FIG. 21 and FIG. 22 illustrate the frequency components of a sound emitted when the rotation speed of a cooling fan was set to be "medium" and the frequency components of a sound emitted when the rotation speed of the cooling fan was set to be "low."

As illustrated in FIG. 21, when the rotation speed of the cooling fan was set to be "low," a sound pressure peak of "86" dB was measured inside the computer room, and when the rotation speed of the cooling fan was set to be "medium," a sound pressure peak of "90" dB was measured in the sound inside the computer room. In other words, inside the computer room, a lauder noise occurred when the rotation speed of the cooling fan was set to be "medium" than when the rotation speed of the cooling fan was set to be "low."

In the example of FIG. 22, when the rotation speed of the cooling fan was set to be "low," a sound pressure peak of "32" dB was measured outside the computer room, and when the rotation speed of the cooling fan was set to be "medium," a sound pressure peak of "25" dB was measured in the sound outside the computer room. In other words, outside the computer room, a lauder noise occurred when the rotation speed of the cooling fan was set to be "low" than when the rotation speed of the cooling fan was set to be "medium."

Thus, outside the computer room, simply lowering the rotation speed of the cooling fan does not necessarily reduce noise. Given this situation, more appropriate noise measures can be taken by installing the sound measuring devices 20c to 20f outside the computer room, not inside the computer room. The sound measuring devices 20c to 20f may be movable to be installed at arbitrary positions.

(5) Rotation Speeds of the Cooling Fans

In the first embodiment, the information processing system 1 sets the rotation speeds listed in the respective rotation speed tables 11a to 11e in the respective cooling fans 33 to 33b. However, an embodiment is not limited thereto. For example, an information processing system may calculate the rotation speeds of cooling fans according to a peak value of the sound pressure level on each occasion.

Figure 23:
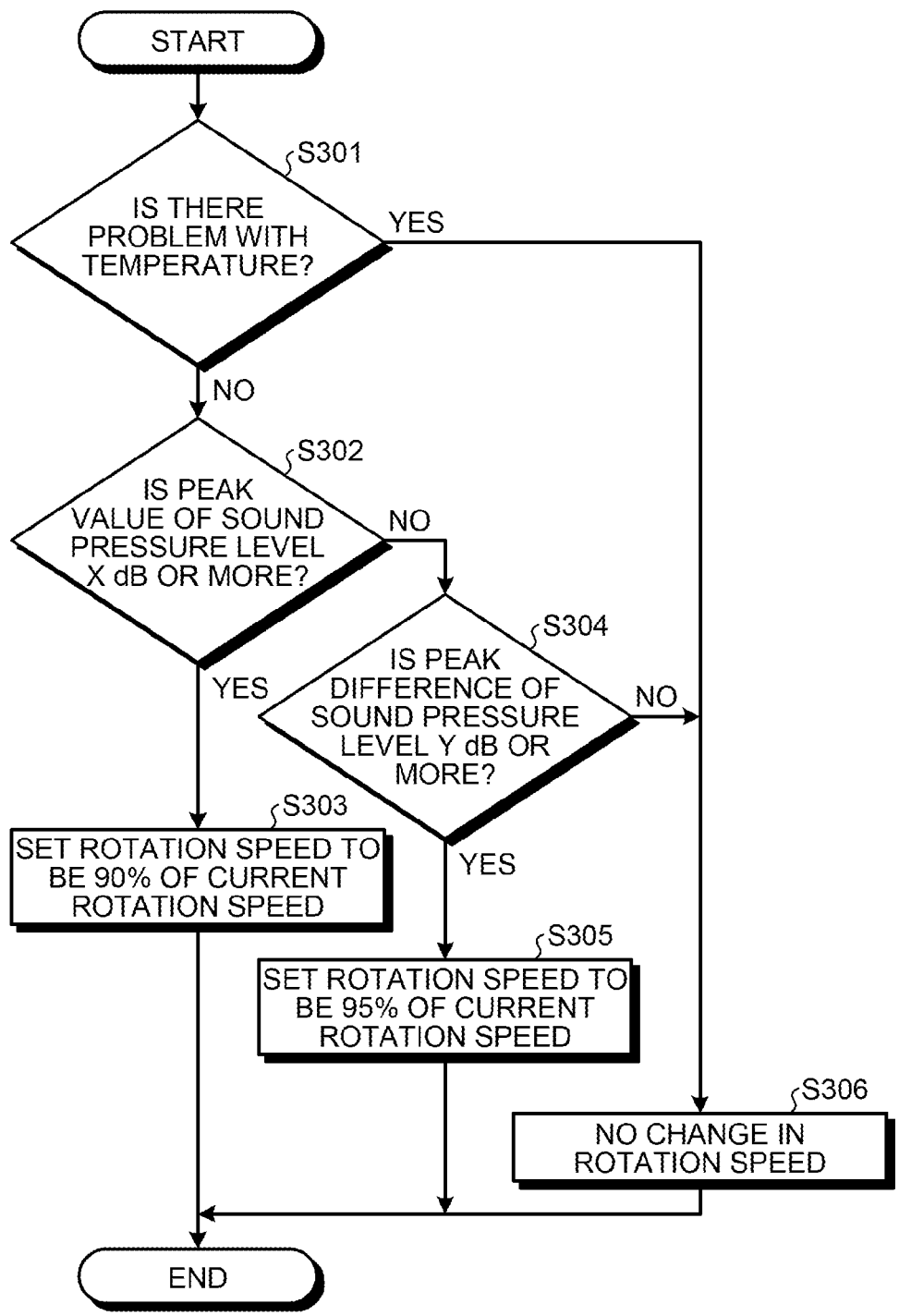
FIG. 23 is a flowchart for illustrating processing through which the information processing system according to the third embodiment calculates a new rotation speed of a cooling fan.

FIG. 23 is a flowchart for illustrating processing through which an information processing system according to the third embodiment calculates a new rotation speed of a cooling fan. For example, this information processing system 1g includes the information processors 30 to 30b and executes the following processing for the information processors 30 to 30b individually.

For example, the information processing system 1g determines that the temperature of the information processor 30 exceeds a predetermined threshold, thereby determining whether there is a problem with the temperature of the information processor 30 (Step S301). If determining that there is no problem with temperature (No at Step S301), the information processing system 1g determines whether the peak value of the sound pressure level of the sound emitted by the information processor 30 is "X" dB or more (Step S302). If determining that the peak value of the sound pressure level is "X" dB or more (Yes at Step S302), the information processing system 1g sets the rotation speed of the cooling fan 33 of the information processor 30 to be 90 percent of the current rotation speed (Step S303). The information processing system 1g then ends the processing on the information processor 30.

If determining that the peak value of the sound pressure level of the sound emitted by the information processor 30 is less than "X" dB (No at Step S302), the information processing system 1g determines whether the peak difference of the sound pressure level is "Y" dB or more (Step S304). If determining that the peak difference of the sound pressure level is "Y" dB or more (Yes at Step S304), the information processing system 1g sets the rotation speed of the cooling fan 33 to be 95 percent of the current rotation speed (Step S305) and ends the processing. If determining that the peak difference of the sound pressure level is less than "Y" dB (No at Step S304), the information processing system 1g leaves the rotation speed of the cooling fan 33 unchanged (Step S306) and ends the processing. If determining that there is a problem with temperature (Yes at Step S301), the information processing system 1g leaves the rotation speed of the cooling fan 33 unchanged (Step S306), because there is no margin in temperature, and ends the processing.

The information processing system 1g executes the above processing on the cooling fans 33 to 33b of the respective information processors 30 to 30b, thereby changing the rotation speeds of the respective cooling fans 33 to 33b appropriately and reducing noise.

(6) Processing According to Temperature and Sound

An information processing system according to the third embodiment may set whether temperature is prioritized or sound is prioritized for the respective information processors in advance and perform different kinds of processing according to whether temperature is prioritized or sound is prioritized. For example, this information processing system 1h includes the information processors 30 to 30b and sets temperature priority information in an information processor that prioritizes temperature and sets sound priority information in an information processor that prioritizes sound among the information processors 30 to 30b.

The information processing system 1h sets the rotation speed of the cooling fan according to a table illustrated in FIG. 24 in the information processor in which the temperature priority information is set. FIG. 24 is a view for illustrating an example of control to a cooling fan of an information processor that prioritizes temperature.

Specifically, if the peak value of the sound pressure level measured when the temperature of the information processor is 30 degrees or more is "X" dB or more, the information processing system 1h increases the rotation speed of the cooling fan by 5 percent. If the peak difference of the sound pressure level measured when the temperature of the information processor is 30 degrees or more is less than "Y" dB, the information processing system 1h increases the rotation speed of the cooling fan by 5 percent. Otherwise, the information processing system 1h increases the rotation speed of the cooling fan by 10 percent.

If neither the peak value of the sound pressure level measured when the temperature of the information processor is 25 degrees or more and less than 30 degrees is "X" dB or more nor if the peak difference of the sound pressure level measured when the temperature of the information processor is 25 degrees or more and less than 30 degrees is "Y" dB or more, the information processing system 1h increases the rotation speed by 5 percent. If the relation between temperature and sound is other than the above-described states, the information processing system 1h leaves the rotation speed of the cooling fan unchanged.

The information processing system 1h sets the rotation speed of the cooling fan according to a table illustrated in FIG. 25 in the information processor in which the sound priority information is set. FIG. 25 is a view for illustrating an example of control to a cooling fan of an information processor that prioritizes temperature.

Specifically, if the peak value of the sound pressure level measured when the temperature of the information processor is 30 degrees or more is "X" dB or more, the information processing system 1h decreases the rotation speed of the cooling fan by 5 percent. If the peak difference of the sound pressure level measured when the temperature of the information processor is 30 degrees or more is "Y" dB or more, the information processing system 1h decreases the rotation speed of the cooling fan by 5 percent. If the peak value of the sound pressure level measured when the temperature of the information processor is 30 degrees or more is less than "X" dB and if the peak difference of the sound pressure level measured when the temperature of the information processor is 30 degrees or more is less than "Y" dB, the information processing system 1h leaves the rotation speed of the cooling fan unchanged.

If the peak value of the sound pressure level measured when the temperature of the information processor is 25 degrees or more and less than 30 degrees is "X" dB or more, the information processing system 1h decreases the rotation speed of the cooling fan by 5 percent. If the peak difference of the sound pressure level measured when the temperature of the information processor is 25 degrees or more and less than 30 degrees is "Y" dB or more, the information processing system 1h decreases the rotation speed of the cooling fan by 5 percent. If the peak value of the sound pressure level measured when the temperature of the information processor is 25 degrees or more and less than 30 degrees is less than "X" dB and if the peak difference of the sound pressure level measured when the temperature of the information processor is 25 degrees or more and less than 30 degrees is less than "Y" dB, the information processing system 1h leaves the rotation speed of the cooling fan unchanged.

If the peak value of the sound pressure level measured when the temperature of the information processor is less than 25 degrees is "X" dB or more, the information processing system 1h decreases the rotation speed of the cooling fan by 10 percent. If the peak difference of the sound pressure level measured when the temperature of the information processor is less than 25 degrees is "Y" dB or more, the information processing system 1h decreases the rotation speed of the cooling fan by 5 percent. If the peak value of the sound pressure level measured when the temperature of the information processor is less than 25 degrees is less than "X" dB and if the peak difference of the sound pressure level measured when the temperature of the information processor is less than 25 degrees is less than "Y" dB, the information processing system 1h leaves the rotation speed of the cooling fan unchanged.

Thus, the information processing system 1h executes different kinds of processing according to whether temperature is prioritized or sound is prioritized, thereby enabling the rotation speed of the cooling fan to be controlled more finely.

(7) Timing of Executing the Processing

The information processing systems 1 to 1h can execute the processing to set the rotation speeds of the respective cooling fans at any timing. For example, the information processing systems 1 to 1h may set the rotation speeds of the respective cooling fans at the turning on of the information processing systems 1 to 1h. The information processing systems 1 to 1h may set the rotation speeds of the respective cooling fans at the restarting of the information processing systems 1 to 1h. The information processing systems 1 to 1h may set the rotation speeds of the respective cooling fans at regular intervals, thereby maintaining optimum rotation speeds at all times.

Figure 26:
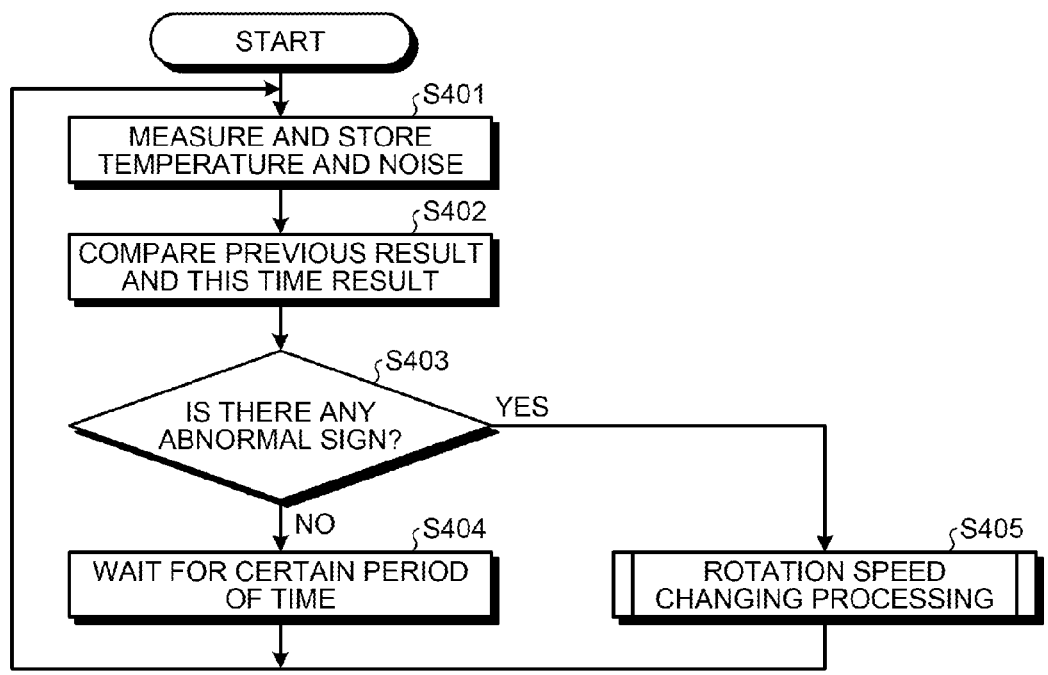
FIG. 26 is a flowchart for illustrating a flow of processing through which an information processing system detects an abnormality.

The information processing systems 1 to 1h may measure temperature and sound at regular intervals, and if any abnormality in temperature or sound occurs based on the measured temperature and sound, set the rotation speeds of the respective cooling fans. For example, FIG. 26 is a flowchart for illustrating a flow of processing through which an information processing system detects an abnormality.

For example, this information processing system 1i measures temperature and sound and stores therein the measured temperature and sound (Step S401). The information processing system 1i then compares the previous measurement result and this time measurement result (Step S402) and determines whether any abnormal sign is detected such as an abrupt rise in temperature or information on the sound pressure level (Step S403). If detecting no abnormal sign (No at Step S403), the information processing system 1i waits for a certain period of time (Step S404) and then measures and stores therein temperature and sound again (Step S401). If detecting any abnormal sign (Yes at Step S403), the information processing system 1i changes the rotation speed of the cooling fan (Step S405). The above various kinds of processing may be adopted to the processing to change the rotation speed of the cooling fan.

Thus, the information processing system 1i executes the processing to change the rotation speed of the cooling fan when an abnormal sign appears, thereby making it possible to avoid the occurrence of an abnormal state beforehand.

(8) Processing to Set Different Rotation Speeds by Time

The information processing systems 1 to 1i change the rotation speeds of the cooling fans based on the temperatures of the respective information processors and the measured sounds. However, an embodiment is not limited thereto. For example, different rotation speeds may be set according to time. Described below is an information processing system 1j that sets different rotation speeds according to time.

FIG. 27 is a view for illustrating rotation speed tables for setting different rotation speeds by temperature. For example, as illustrated in FIG. 27, the information processing system 1j includes a rotation speed table 11f for setting rotation speeds of the duration from 8:00 AM to 6:00 PM and a rotation speed table 11g for setting rotation speeds of the duration from 6:00 PM to 8:00 AM. In the duration from 8:00 AM to 6:00 PM, the information processing system 1j sets the rotation speeds of the cooling fans to be the rotation speeds listed in the rotation speed table 11f according to the temperatures of the respective information processors. In the duration from 6:00 PM to 8:00 AM, the information processing system 1j sets the rotation speeds to be the rotation speeds listed in the rotation speed table 11g.

Thus, the information processing system 1j sets the rotation speeds of the cooling fans using different rotation speed tables by time, thereby enabling the rotation speeds of the cooling fans to be set appropriately. For example, the information processing system 1*j* can perform a setting that does not consider sound after operators go home and perform a setting that considers sound in a time zone during which operators are present.

(9) Active Sound Sources

The information processing system 1*a* increases the rotation speeds of the cooling fans 33 to 33*b* and reduces noise using the active sound sources 21 to 21*b* if the measured temperature is higher than the predetermined threshold and if the sound pressure level is larger than the predetermined threshold or if the peak value of the sound pressure level of the frequency components is larger than the predetermined threshold. However, an embodiment is not limited thereto. For example, the information processing system 1*a* may cause the active sound source 21 to generate sounds with opposite phases of the sounds measured by the respective sound measuring devices 20 to 20*b*.

(10) Information Processors

The monitoring servers 10 to 10*d* set the rotation speeds of the respective cooling fans of the information processors. However, an embodiment is not limited thereto. In other words, for any electronic device that includes a cooling fan capable of setting its rotation speed and cools the inside of a casing, the monitoring servers 10 to 10*d* may set the rotation speed of the cooling fan of the electronic device.

(11) Computer Program

Figure 28:
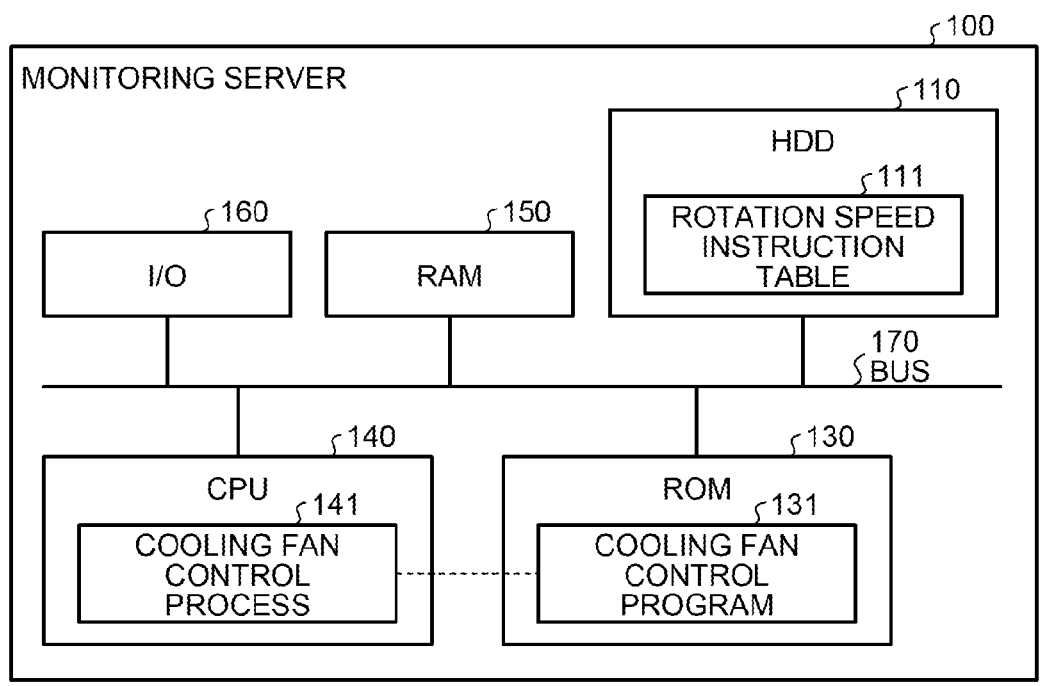
FIG. 28 is a diagram for illustrating an example of a monitoring server that executes a cooling fan control program.

For the monitoring servers 10 and 10*a*, described are cases of achieving the various kinds of processing using hardware. However, an embodiment is not limited thereto. The various kinds of processing may be achieved by executing a computer program prepared in advance by a computer. Described below with reference to FIG. 28 is an example of a control program of a monitoring server having the same function as the monitoring server 10 disclosed in the first embodiment by being executed by a computer. FIG. 28 is a diagram for illustrating an example of a monitoring server that executes a control program of a monitoring server.

This monitoring server 100 exemplified in FIG. 28 connects a hard disk drive (HDD) 110, a read only memory (ROM) 130, a central processing unit (CPU) 140, and a random access memory (RAM) 150 through a bus 170. Connected to the monitoring server 100 exemplified in FIG. 28 is an input/output (I/O) 160 for transmitting information indicating rotation speeds to the fan rotation speed controllers of the respective information processors and receiving temperature information and sound information.

The HDD 110 stores therein a rotation speed instruction table 111 in advance. The rotation speed instruction table 111 includes the same information as the rotation speed tables 11*a* to 11*e* according to the first embodiment. The ROM 130 stores therein a cooling fan control program 131 in advance. The CPU 140 reads and executes the cooling fan control program 131 to make it function as a cooling fan control process 141. The cooling fan control process 141 exhibits the same functions as the units 12 to 17 illustrated in FIG. 1.

The cooling fan control program described in the present embodiment can be achieved by executing a program prepared in advance by a computer such as a personal computer and a workstation. This program can also be distributed through a network such as the Internet. This program is recorded in a computer-readable recording medium such as a hard disk, a flexible disk (FD), a compact disc read only memory (CD-ROM), a magnetooptical disc (MO), and a digital versatile disc (DVD). This program can also be executed by being read from a recording medium by a computer.

The control program of a monitoring server described in the present embodiment can control the monitoring server 100 so that the same functions as the pieces of processing executed by the respective monitoring servers 10*a* to 10*d*, not only the monitoring server 10.

In one aspect, the technology disclosed by the present application can reduce noise.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic system including a plurality of electronic devices and a monitoring processor that controls the plurality of electronic devices respectively, the electronic system comprising:

a sound pressure measuring device that measures pieces of sound pressure information of sounds emitted by the plurality of electronic devices respectively, the electronic devices each include a cooling fan that cools inside of a casing and a fan controller that controls the cooling fan, and a temperature measuring unit configured to measure pieces of temperature information inside the casings of the plurality of electronic devices, the monitoring processor includes a fan speed controller that performs control on the fan controllers of the plurality of electronic devices respectively to make rotation speed of the cooling fan of any electronic device different from rotation speed of the cooling fan of another electronic device based on the pieces of temperature information inside the casings of the electronic devices measured by the temperature measuring unit and the pieces of sound pressure information of sounds emitted by the plurality of electronic devices measured by the sound pressure measuring device.

2. The electronic system according to claim 1, wherein the fan speed controller performs control to make the rotation speed of the cooling fan of the electronic device to be subjected to priority control different from the rotation speed of the cooling fan of the other electronic device based on whether the pieces of temperature information measured are higher than a predetermined temperature or whether the pieces of sound pressure information measured by the sound pressure measuring device are larger than a predetermined sound pressure.

3. The electronic system according to claim 1, wherein
the monitoring processor further includes a group information storage that holds group information indicating in which group the plurality of electronic devices are included, and
the fan speed controller performs control on the fan controllers of the plurality of electronic devices respectively to make the rotation speed of the cooling fan of an electronic device included in any group different from the rotation speed of the cooling fan of an electronic device included in another group based on the pieces of sound pressure information of sounds emitted by the plurality of electronic devices measured and the group information held by the group information storage.

4. A method of controlling an electronic system that includes a plurality of electronic devices each including a cooling fan and a fan controller that controls the cooling fan and a monitoring processor that controls the plurality of electronic devices, the method comprising:
by a sound pressure measuring device, measuring pieces of sound pressure information of sounds emitted by the plurality of electronic devices using a processor; and
by a fan speed controller included in the monitoring processor, performing control on the fan controllers of the plurality of electronic devices respectively to be subjected to priority control whose temperature inside a casing is lower than another electronic device to make the rotation speed of the cooling fan of the electronic device to be subjected to priority control different from the rotation speed of the cooling fan of the other electronic device based on pieces of temperature information inside the casings of the electronic devices measured and the pieces of sound pressure information of sounds emitted by the plurality of electronic devices measured by the sound pressure measuring device using the processor.

5. The method of controlling an electronic system according to claim 4, wherein the fan speed controller performs control to make the rotation speed of the cooling fan of the electronic device to be subjected to priority control different from the rotation speed of the cooling fan of the other electronic device based on whether the pieces of temperature information measured are higher than a predetermined temperature or whether the pieces of sound pressure information measured by the sound pressure measuring device are larger than a predetermined sound pressure using the processor.

6. The method of controlling an electronic system according to claim 5, wherein the fan speed controller performs control on the fan controllers of the plurality of electronic devices respectively to make the rotation speed of the cooling fan of an electronic device included in any group different from the rotation speed of the cooling fan of an electronic device included in another group based on the pieces of sound pressure information of sounds emitted by the plurality of electronic devices measured by the sound pressure measuring device and group information indicating in which group the plurality of electronic devices are included and held by group information storage of the plurality of electronic devices using the processor.

7. A non-transitory computer-readable recording medium having stored therein a program that causes a computer to execute an electronic system control process, the program of a monitoring processor that controls a plurality of electronic devices each including a cooling fan that cools inside of a casing and a fan controller that controls the cooling fan, the control program causing a processor included in the monitoring processor to execute:
acquiring pieces of sound pressure information of sounds emitted by the plurality of electronic devices measured by a sound pressure measuring device;
performing control on the fan controllers of the plurality of electronic devices respectively to be subjected to priority control whose temperature inside a casing is lower than another electronic device to make the rotation speed of the cooling fan of the electronic device to be subjected to priority control different from the rotation speed of the cooling fan of the other electronic device based on pieces of temperature information inside the casings of the electronic devices measured and the pieces of sound pressure information of sounds emitted by the plurality of electronic devices measured by the sound pressure measuring device.

8. The control program of a monitoring processor according to claim 7, further causing the processor to execute:
performing control on the fan controllers of the plurality of electronic devices respectively to make the rotation speed of the cooling fan of the electronic device to be subjected to priority control different from the rotation speed of the cooling fan of another electronic device based on whether the pieces of temperature information measured are higher than a predetermined temperature or whether the pieces of sound pressure information measured are larger than a predetermined sound pressure.

9. The monitoring processor control program according to claim 8, further causing the processor to execute:
performing control on the fan controllers included in the plurality of electronic devices on the fan controllers of the plurality of electronic devices respectively to make the rotation speed of the cooling fan of an electronic device included in any group different from the rotation speed of the cooling fan of an electronic device included in another group based on the pieces of sound pressure information of sounds emitted by the plurality of electronic devices measured by the sound pressure measuring device and group information indicating in which group the plurality of electronic devices are included and held by group information storage of the plurality of electronic devices.

* * * * *